(12) United States Patent
Isa

(10) Patent No.: US 8,383,434 B2
(45) Date of Patent: Feb. 26, 2013

(54) THIN FILM TRANSISTOR AND MANUFACTURING METHOD THEREOF

(75) Inventor: Toshiyuki Isa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 13/020,827

(22) Filed: Feb. 4, 2011

(65) Prior Publication Data

US 2011/0204364 A1    Aug. 25, 2011

(30) Foreign Application Priority Data

Feb. 22, 2010   (JP) .................................. 2010-036699

(51) Int. Cl.
  *H01L 21/00*   (2006.01)
(52) U.S. Cl. ............ 438/30; 438/149; 438/96; 438/151; 438/158; 438/159; 257/E21.411; 257/E21.412
(58) Field of Classification Search .................... 438/30, 438/149, 151, 158, 159; 257/57, 59, 66, 257/72, E21.411, E21.414, E21.412
See application file for complete search history.

(56) References Cited

U.S. PATENT DOCUMENTS

| | | | |
|---|---|---|---|
| 4,409,134 A | 10/1983 | Yamazaki | |
| 5,686,349 A | 11/1997 | Nakata | |
| 7,432,906 B2 | 10/2008 | Nakajima et al. | |
| 7,511,709 B2 | 3/2009 | Koyama et al. | |
| 2003/0038288 A1* | 2/2003 | Suzuki et al. | 257/72 |
| 2005/0012097 A1 | 1/2005 | Yamazaki | |
| 2008/0299689 A1 | 12/2008 | Yamazaki | |
| 2009/0047759 A1 | 2/2009 | Yamazaki et al. | |
| 2009/0047761 A1 | 2/2009 | Yamazaki et al. | |
| 2009/0072237 A1 | 3/2009 | Yamazaki et al. | |
| 2009/0142909 A1 | 6/2009 | Jinbo et al. | |
| 2009/0321737 A1 | 12/2009 | Isa et al. | |
| 2010/0124804 A1* | 5/2010 | Takahashi et al. | 438/158 |
| 2010/0201659 A1 | 8/2010 | Miyake et al. | |
| 2010/0216285 A1 | 8/2010 | Yokoi et al. | |
| 2011/0101354 A1* | 5/2011 | Saito et al. | 257/59 |
| 2011/0121300 A1 | 5/2011 | Miyairi et al. | |
| 2011/0147754 A1 | 6/2011 | Isa et al. | |

FOREIGN PATENT DOCUMENTS

| | | |
|---|---|---|
| JP | 05-129608 | 5/1993 |
| JP | 07-131030 | 5/1995 |
| JP | 2001-053283 | 2/2001 |
| JP | 2003-037278 | 2/2003 |
| JP | 2005-049832 | 2/2005 |
| JP | 2005-191546 | 7/2005 |
| JP | 2008-124392 | 5/2008 |

* cited by examiner

*Primary Examiner* — Steven Loke
*Assistant Examiner* — Cuong Nguyen
(74) *Attorney, Agent, or Firm* — Nixon Peabody LLP; Jeffrey L. Costellia

(57) ABSTRACT

A method for manufacturing a thin film transistor having high electric characteristics with high productivity. In the method for forming a channel region of a dual-gate thin film transistor including a first gate electrode and a second gate electrode which faces the first gate electrode with the channel region provided therebetween, a first microcrystalline semiconductor film is formed under a first condition for forming a microcrystalline semiconductor film in which a space between crystal grains is filled with an amorphous semiconductor, and a second microcrystalline semiconductor film is formed over the first microcrystalline semiconductor film under a second condition for promoting crystal growth.

9 Claims, 16 Drawing Sheets

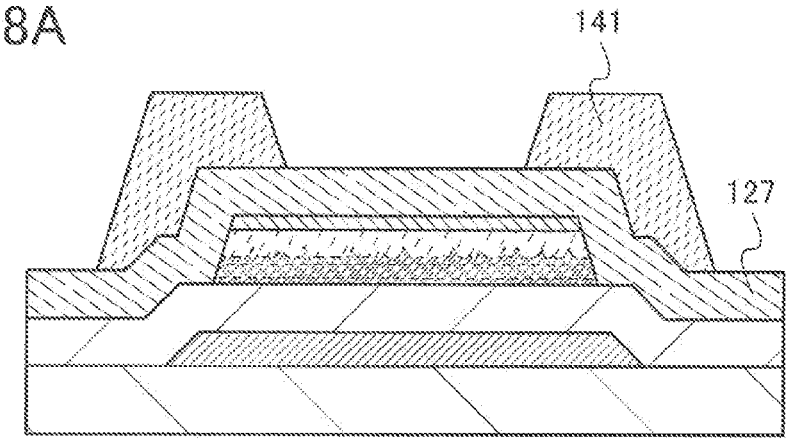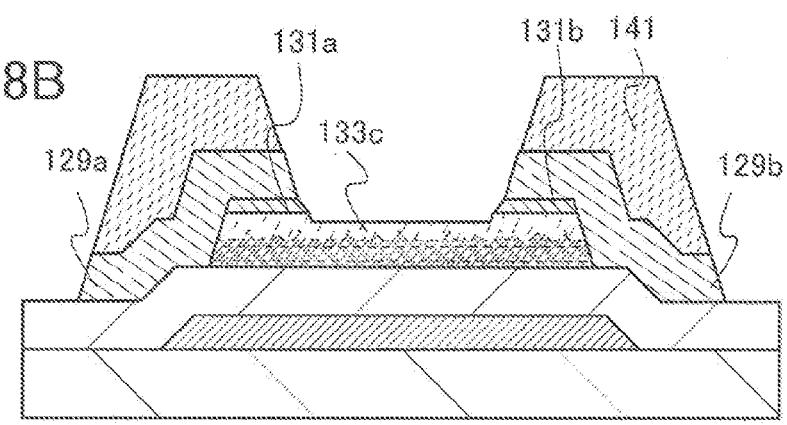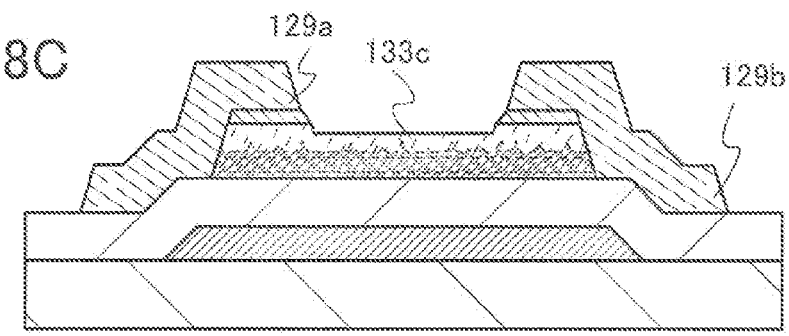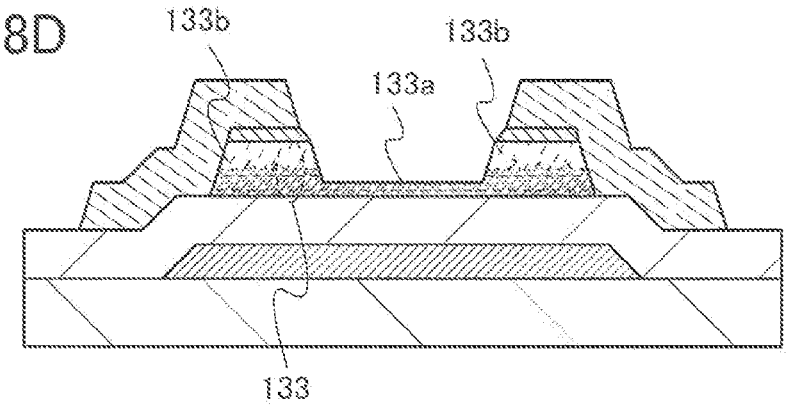

THIN FILM TRANSISTOR AND MANUFACTURING METHOD THEREOF

BACKGROUND OF THE INVENTION

1. Field of the Invention

The present invention relates to a thin film transistor and a method for manufacturing the thin film transistor, and a display device using the thin film transistor.

2. Description of the Related Art

As one type of field-effect transistor, a thin film transistor whose channel region is formed using a semiconductor film which is formed over a substrate having an insulating surface is known. Techniques in which amorphous silicon, microcrystalline silicon, or polycrystalline silicon is used for the semiconductor film which is used for the channel region of the thin film transistor have been disclosed (see Patent Documents 1 to 5). A typical application of thin film transistors is a liquid crystal display television device, in which the thin film transistors are each put to practical use as a switching transistor for each pixel in a display screen.

REFERENCE

Patent Document 1: Japanese Published Patent Application No. 2001-053283
Patent Document 2: Japanese Published Patent Application No. H5-129608
Patent Document 3: Japanese Published Patent Application No. 2005-049832
Patent Document 4: Japanese Published Patent Application No. H7-131030
Patent Document 5: Japanese Published Patent Application No. 2005-191546

SUMMARY OF THE INVENTION

A thin film transistor in which a channel region is formed using an amorphous silicon film has problems of low field-effect mobility and low on-state current. On the other hand, a thin film transistor in which a channel region is formed using a microcrystalline silicon film has a problem in that, though the field-effect mobility is improved, the off-state current is higher than that of the thin film transistor whose channel region is formed using an amorphous silicon film and thus sufficient switching characteristics cannot be obtained.

A thin film transistor whose channel region is formed using a polycrystalline silicon film features in that the field-effect mobility is far higher than those of the above-described two kinds of thin film transistors and the on-state current is high. These features enable this kind of thin film transistor to be used not only as a switching transistor in a pixel but also as an element of a driver circuit that needs to drive at high speed.

However, formation of the thin film transistor whose channel region is formed using a polycrystalline silicon film involves a crystallization step for a semiconductor film and has a problem of higher manufacturing costs, as compared to formation of the thin film transistor whose channel region is formed using an amorphous silicon film. For example, a laser annealing technique in the process for forming a polycrystalline silicon film has a problem in that large-screen liquid crystal panels cannot be produced efficiently because the area capable of being irradiated with the laser beam is small.

A glass substrate for manufacturing display panels has been grown in size from year to year in the following ascending order: the 3rd generation (550 m×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), and the 8th generation (2200 mm×2400 mm). The size is expected to grow to the 9th generation (2400 mm×2800 mm or 2450 mm×3050 mm) and then to the 10th generation (2950 mm×3400 mm) from now on. The increase in size of the glass substrate is based on the concept of minimum cost design.

On the other hand, a technique with which a thin film transistor capable of high-speed operation can be manufactured with high productivity over a large-sized mother glass substrate like the 10th generation (2950 mm×3400 mm) mother glass substrate has not been established yet, which is a problem in industry.

In view of the above, it is an object of an embodiment of the present invention to provide a thin film transistor which has high electric characteristics. It is an object of an embodiment of the present invention to provide a method for manufacturing a thin film transistor which has high electric characteristics with high productivity.

One embodiment of the present invention is a method for forming a channel region of a dual-gate thin film transistor including a first gate electrode and a second gate electrode which faces the first gate electrode with the channel region provided therebetween. According to the forming method, a first microcrystalline semiconductor film is formed under a first condition for forming a microcrystalline semiconductor film in which a space between crystal grains is filled with an amorphous semiconductor, and a second microcrystalline semiconductor film is formed over the first microcrystalline semiconductor film under a second condition for promoting crystal growth.

According to a method for manufacturing a thin film transistor, which is one embodiment of the present invention, a first gate electrode is formed over a substrate; a first gate insulating film is formed over the substrate and the first gate electrode; a first microcrystalline semiconductor film is formed over the first gate insulating film under a first condition; a second microcrystalline semiconductor film is formed over the first microcrystalline semiconductor film under a second condition; a semiconductor film including a microcrystalline semiconductor region and an amorphous semiconductor region is formed over the second microcrystalline semiconductor film; a first impurity semiconductor film is formed over the semiconductor film; part of the first impurity semiconductor film is etched to form an island-shaped second impurity semiconductor film; parts of the first microcrystalline semiconductor film, the second microcrystalline semiconductor film, and the semiconductor film are etched to form an island-shaped first semiconductor stack; a wiring which functions as a source/drain electrode is formed over the island-shaped second impurity semiconductor film; the island-shaped second impurity semiconductor film is etched to form a pair of impurity semiconductor films which function as a source region and a drain region; part of the first semiconductor stack is etched to form a second semiconductor stack in which a microcrystalline semiconductor region and a pair of amorphous semiconductor regions are stacked; a second gate insulating film is formed over the wiring, the pair of impurity semiconductor films, the second semiconductor stack, and the first gate insulating film; and a second gate electrode is formed over the second gate insulating film. The first condition is a condition for forming a microcrystalline semiconductor film in which a space between crystal grains is filled with an amorphous semiconductor, and the second condition is a condition for promoting crystal growth.

According to one embodiment of the present invention, in the above-described method for manufacturing a thin film transistor, the flow rate of hydrogen is 125 times or more as high as that of a deposition gas containing silicon or germanium and 180 times or less as high as that of the deposition gas in the first condition, and the flow rate of hydrogen is 210 times or more as high as that of the deposition gas and 1500 times or less as high as that of the deposition gas in the second condition.

One embodiment of the present invention is a thin film transistor comprising a first gate electrode provided over a substrate; a first gate insulating film provided over the first gate electrode; a microcrystalline semiconductor film provided over the first gate insulating film; a pair of amorphous semiconductor regions provided over the microcrystalline semiconductor film; an impurity semiconductor film provided over the pair of amorphous semiconductor regions; a wiring provided over the impurity semiconductor film; a second gate insulating film provided over the wiring, the impurity semiconductor film, the pair of amorphous semiconductor regions, the microcrystalline semiconductor film, and the first gate insulating film; and a second gate electrode provided over the second gate insulating film. In the microcrystalline semiconductor film, a region on a side which is in contact with the first gate insulating film includes crystal grains and an amorphous semiconductor with which a space between the crystal grains is filled, and a region on a side which is in contact with the pair of amorphous semiconductor regions includes a microcrystalline semiconductor having high crystallinity.

The semiconductor film formed over the second microcrystalline semiconductor film includes a microcrystalline semiconductor region and an amorphous semiconductor region. The microcrystalline semiconductor region and the amorphous semiconductor region include nitrogen. The nitrogen concentration profile has a peak concentration greater than or equal to $1 \times 10^{20}$ atoms/cm$^3$ and less than or equal to $1 \times 10^{21}$ atoms/cm$^3$, preferably $2 \times 10^{20}$ atoms/cm$^3$ and less than or equal to $1 \times 10^{21}$ atoms/cm$^3$. Further, in the amorphous semiconductor region, semiconductor crystal grains whose grain size is greater than or equal to 1 nm and less than or equal to 10 nm may be dispersed. Here, the concentration is measured by secondary ion mass spectrometry (SIMS) unless otherwise described.

Further, the microcrystalline semiconductor region and the amorphous semiconductor region may include nitrogen, an NH group, or an NH$_2$ group. Dangling bonds of semiconductor atoms which exist in the interface between microcrystalline semiconductor regions adjacent to each other (i.e., a crystal grain boundary) and the interface between the microcrystalline semiconductor region and the amorphous semiconductor region are cross-linked with an NH group, so that defect levels are reduced, which leads to formation of a path through which carriers move. A dangling bond may be terminated with an NH$_2$ group, so that defect levels are reduced.

In the thin film transistor according to one embodiment of the present invention, the first microcrystalline semiconductor film is formed under the first condition for forming a microcrystalline semiconductor film in which a space between crystal grains is filled with an amorphous semiconductor, and the second microcrystalline semiconductor film is formed over the first microcrystalline semiconductor film under the second condition for promoting crystal growth, so that the second microcrystalline semiconductor film in which the space between crystal grains is very small and the crystallinity on a back-channel side is high can be formed, which enables the on-state current and the field-effect mobility of the thin film transistor to be increased. In addition, the amorphous semiconductor region in the semiconductor film formed over the second microcrystalline semiconductor film is a well-ordered semiconductor which has fewer defects and whose tail of a level at a band edge in the valence band is steep, which widens the band gap and suppresses the amount of tunnel current. Therefore, the amorphous semiconductor region provided between the microcrystalline semiconductor region and the impurity semiconductor film enables the off-state current of the thin film transistor to be reduced.

The back channel is a region in the above-described second semiconductor stack, which overlaps with neither the source region nor the drain region and is provided on the second gate insulating film side. Specifically, the back channel refers to a region of the second semiconductor stack, which is near and includes a region which is in contact with the second gate insulating film.

Further, the on-state current refers to a current which flows between source electrode and drain electrode when the thin film transistor is on. For example, in the case of an n-channel thin film transistor, the on-state current refers to a current which flows between source electrode and drain electrode when a gate voltage of the transistor is higher than a threshold voltage of the transistor.

Further, the term off-state current refers to a current which flows between source electrode and drain electrode when the thin film transistor is off. For example, in the case of an n-channel thin film transistor, the off state current refers to a current which flows between source electrode and drain electrode when a gate voltage of the transistor is higher than the threshold voltage of the transistor.

A thin film transistor with low off-state current, high on-state current, and high field-effect mobility can be manufactured with high productivity.

BRIEF DESCRIPTION OF THE DRAWINGS

FIGS. 8A to 8D are cross-sectional views illustrating a manufacturing method of a transistor according to an embodiment of the present invention.

DETAILED DESCRIPTION OF THE INVENTION

Figure 1A:
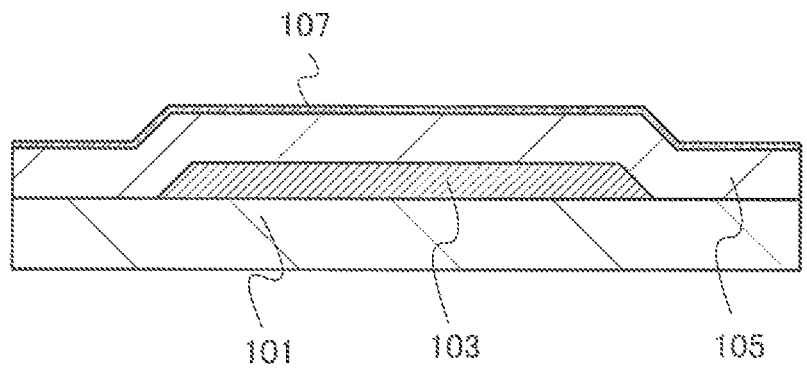
FIGS. 1A to 1D are cross-sectional views illustrating a manufacturing method of a transistor according to an embodiment of the present invention.

Hereinafter, embodiments of the present invention are described with reference to drawings. However, the present invention is not limited to the following description. It is easily understood by those skilled in the art that the mode and detail can be variously changed unless departing from the scope and spirit of the present invention. Therefore, the present invention is not construed as being limited to the following description of the embodiments and examples. Reference numerals denoting portions are commonly used throughout the drawings.

(Embodiment 1)

In Embodiment 1, a manufacturing method of a transistor according to one embodiment of the present invention will be described with reference to FIGS. 1A to 1D, FIGS. 2A and 2B, FIG. 3, FIGS. 4A and 4B, FIGS. 5A to 5C, and FIGS. 6A to 6D. An n-channel thin film transistor has higher carrier mobility than a p-channel thin film transistor. Further, it is preferable that all thin film transistors formed over the same substrate have the same conductivity type because the number of manufacturing steps can be reduced. Therefore, in this embodiment, a method for manufacturing an n-channel thin film transistor is described.

As shown in FIG. 1A, a gate electrode 103 (also called a first gate electrode) is formed over a substrate 101. Next, a gate insulating film 105 which covers the gate electrode 103 is formed, and a first microcrystalline semiconductor film 107 is formed over the gate insulating film 105.

As the substrate 101, a glass substrate; a ceramic substrate; a plastic substrate which has high heat resistance enough to withstand a process temperature of this manufacturing process; or the like can be used. In the case where the substrate does not need to have a light-transmitting property, a metal substrate, such as a stainless steel alloy substrate, provided with an insulating film on its surface may be used. As the glass substrate, for example, an alkali-free glass substrate of barium borosilicate glass, aluminoborosilicate glass, aluminosilicate glass, or the like may be used. There is no limitation on the size of the substrate 101; for example, any of the 3rd to 10th generation glass substrates, which are often used in the field of the above-described flat panel display, can be used.

The gate electrode 103 can be formed as a single layer or a stacked layer using a metal material such as molybdenum, titanium, chromium, tantalum, tungsten, aluminum, copper, neodymium, scandium, or nickel or an alloy material which includes any of these materials as a main component. A semiconductor typified by polycrystalline silicon with an impurity element such as phosphorus doped, an AgPdCu alloy, an Al—Nd alloy, an Al—Ni alloy, or the like may be used as well.

For example, the following is preferable as a two-layer structure of the gate electrode 103; a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, a two-layer structure in which a titanium nitride film and a molybdenum film are stacked, a two-layer structure in which a copper-magnesium-oxide alloy film and a copper film are stacked, a two-layer structure in which a copper-manganese-oxide alloy film and a copper film are stacked, a two-layer structure in which a copper-manganese alloy film and a copper film are stacked, or the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film functioning as a barrier film over a film having low electric resistance, electric resistance can be low and diffusion of a metal element from the metal film into the semiconductor film can be prevented.

The gate electrode 103 can be formed in the following manner: a conductive film is formed over the substrate 101 by a sputtering method or a vacuum evaporation method using the above-described material(s); a mask is formed over the conductive film by a photolithography method, an inkjet method, or the like; and the conductive film is etched using the mask. Alternatively, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a film of a nitride of any of the above-described metal materials may be provided between the substrate 101 and the gate electrode 103. In this embodiment, a conductive film is formed over the substrate 101 and etched using a mask made of a resist formed by a photolithography method.

The side surface of the gate electrode 103 is preferably tapered. This is because an insulating film, a semiconductor film, and a wiring formed over the gate electrode 103 can be prevented from being cut in a step of the gate electrode 103. In order to taper the side surface of the gate electrode 103, etching may be performed while the resist mask is made to recede.

Through the step of forming the gate electrode 103, a gate wiring (a scan line) and a capacitor wiring can also be fanned at the same time. The scan line means a wiring for selecting a pixel, while the capacitor wiring means a wiring which is connected to one of electrodes of a storage capacitor in a pixel. However, without limitation thereto, either one or both of the gate wiring and the capacitor wiring may be formed by a separate step from that of the gate electrode 103.

The gate insulating film 105 can be formed as a single layer or a stacked layer using a silicon oxide film, a silicon nitride film, a silicon oxynitride film, and/or a silicon nitride oxide film by a CVD method, a sputtering method, or the like. Particularly, by forming the gate insulating film 105 using silicon oxide or silicon oxynitride, fluctuation in threshold voltage of the thin film transistor can be suppressed.

The silicon oxynitride means silicon that contains more oxygen than nitrogen, and preferably contains, when measured using Rutherford backscattering spectrometry (RBS) and hydrogen forward scattering (HFS), oxygen, nitrogen, silicon, and hydrogen at concentrations ranging from 50 to 70 at. %, 0.5 to 15 at. %, 25 to 35 at. %, and 0.1 to 10 at. %, respectively. Further, the silicon nitride oxide means silicon that contains more nitrogen than oxygen, and preferably contains, when measured using RBS and HFS, oxygen, nitrogen, silicon, and hydrogen at concentrations ranging from 5 to 30 at. %, 20 to 55 at. %, 25 to 35 at. %, and 10 to 30 at. %, respectively. Note that percentages of contained nitrogen, oxygen, silicon, and hydrogen fall within the ranges given above, where the total number of atoms contained in the silicon oxynitride or the silicon nitride oxide is defined as 100 at. %.

The gate insulating film 105 can be formed by a CVD method, a sputtering method, or the like. In a step of forming the gate insulating film 105 by a CVD method, glow discharge plasma is generated by applying high-frequency power with a frequency of 3 MHz to 30 MHz, typically 13.56 MHz or 27.12 MHz, or high-frequency power in the VHF band with a frequency greater than 30 MHz and less than or equal to about 300 MHz, typically 60 MHz. Alternatively, glow discharge plasma may be generated by applying high-frequency power with a microwave frequency of 1 GHz or more. The use of the high-frequency power in the VHF band or with the microwave frequency can increase the deposition rate. A pulsed oscillation by which high-frequency power is applied in a pulsed manner or a continuous oscillation by which high-frequency power is applied continuously may be applied. Further, a high-frequency power in a HF band may be superimposed on the high-frequency power in the VHF band, so that unevenness of plasma even in a large-sized substrate can be reduced, whereby the uniformity can be improved, and the deposition rate can be increased. When the gate insulating film 105 is formed using a microwave plasma CVD apparatus with the frequency of 1 GHz or more, the dielectric strength between the gate electrode and a drain and source electrodes of the thin film transistor can be improved, so that a highly reliable thin film transistor can be obtained.

Further, by forming a silicon oxide film by a CVD method using an organosilane gas as the gate insulating film 105, the crystallinity of the semiconductor film which is formed later can be improved, so that the on-state current and the field-effect mobility of the thin film transistor can be increased. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The first microcrystalline semiconductor film 107 is typically formed using a microcrystalline silicon film, a microcrystalline silicon germanium film, a microcrystalline germanium film, or the like. The first microcrystalline semiconductor film 107 includes crystal grains and an amorphous semiconductor with which a space between the crystal grains is filled. It is preferable that the thickness of the first microcrystalline semiconductor film 107 be greater than or equal to 1 nm and less than or equal to 4 nm.

The first microcrystalline semiconductor film 107 is formed under a first condition by glow discharge plasma with the use of a mixture of hydrogen and a deposition gas containing silicon or germanium in a reaction chamber of a plasma CVD apparatus. Alternatively, the first microcrystalline semiconductor film 107 may be formed under the first condition by glow discharge plasma with the use of a mixture of a deposition gas containing silicon or germanium, hydrogen, and a rare gas such as helium, argon, neon, krypton, or xenon. Microcrystalline silicon, microcrystalline silicon germanium, microcrystalline germanium, or the like is formed under the first condition in which the flow rate of hydrogen is 125 times or more as high as that of the deposition gas containing silicon or germanium and 180 times or less as high as that of the deposition gas, preferably 150 times or more as high as that of the deposition gas and 170 times or less as high as that of the deposition gas such that the deposition gas is diluted. The deposition temperature in that case is preferably room temperature to 300° C., far preferably 200° C. to 280° C.

As typical examples of the deposition gas containing silicon or germanium, there are $SiH_4$, $Si_2H_6$, $GeH_4$, $Ge_2H_6$, or the like.

In the case where the gate insulating film 105 is formed using a silicon nitride film, an amorphous semiconductor is easily formed at an early stage of deposition of the first microcrystalline semiconductor film 107, which decreases the crystallinity of the first microcrystalline semiconductor film 107, so that the electric characteristics of the thin film transistor become poor. Therefore, a low temperature condition in which the temperature for deposition of the first microcrystalline semiconductor film 107 is 200° C. to 250° C. is preferably employed. According to the low temperature condition, initial nucleation density is increased, an amorphous semiconductor formed over the gate insulating film 105 is reduced, and the crystallinity of the first microcrystalline semiconductor film 107 is improved. Further, the surface of the gate insulating film 105 formed using the silicon nitride film may be oxidized, so that the adhesion with the first microcrystalline semiconductor film 107 can be improved. As the oxidation treatment, exposure to an oxidizing gas, plasma treatment in an oxidation gas, or the like can be given. Examples of the oxidation gas include oxygen, ozone, dinitrogen monoxide, water vapor, a mixed gas of oxygen and hydrogen, and the like.

A rare gas such as helium, argon, neon, krypton, or xenon may be used as a source gas for the first microcrystalline semiconductor film 107, so that the deposition rate of the first microcrystalline semiconductor film 107 can be increased. Moreover, the increased deposition rate decreases the amount of impurity entering the first microcrystalline semiconductor film 107, so that the crystallinity of the first microcrystalline semiconductor film 107 can be improved. Accordingly, the on-state current and field-effect mobility of the thin film transistor can be increased and throughput of the thin film transistor can also be increased.

The condition used for the gate insulating film 105 can be employed for generating the glow discharge plasma to form the first microcrystalline semiconductor film 107, as appropriate.

Before the first microcrystalline semiconductor film 107 is formed, an impurity element/impurity elements in the process chamber of the CVD apparatus may be removed by evacuation of the process chamber and introduction of the deposition gas containing silicon or germanium, so that the amount of impurity in the first microcrystalline semiconductor film 107 can be reduced, which enables the electric characteristics of the thin film transistor to be improved. Further, before the first microcrystalline semiconductor film 107 is formed, plasma may be generated in an atmosphere containing fluorine such as a fluorine atmosphere, a nitrogen fluoride atmosphere, or a silane fluoride atmosphere, and the gate insulating film 105 may be exposed to the fluorine plasma, so that a dense microcrystalline semiconductor film can be formed as the first microcrystalline semiconductor film 107.

Figure 1B:
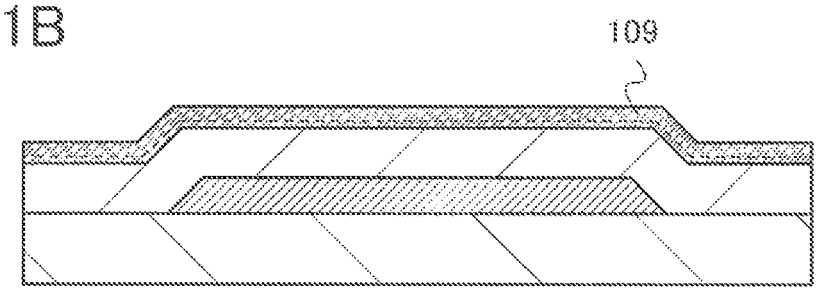

Next, as shown in FIG. 1B, a second microcrystalline semiconductor film 109 is formed over the first microcrystalline semiconductor film 107. The second microcrystalline semiconductor film 109 is formed under a condition for promoting crystal growth. It is preferable that the thickness of the second microcrystalline semiconductor film 109 be greater than or equal to 30 nm and less than or equal to 100 nm.

The second microcrystalline semiconductor film 109 is formed under a second condition by glow discharge plasma with the use of a mixture of hydrogen and a deposition gas containing silicon or germanium in a process chamber of a plasma CVD apparatus. Alternatively, the second microcrystalline semiconductor film 109 may be formed under the second condition by glow discharge plasma with the use of a mixture of a deposition gas containing silicon or germanium, hydrogen, and a rare gas such as helium, argon, neon, krypton, or xenon. Microcrystalline silicon, microcrystalline silicon germanium, microcrystalline germanium, or the like is formed under the second condition in which the flow rate of hydrogen is 210 times or more as high as that of the deposition gas containing silicon or germanium and 1500 times or less as high as that of the deposition gas, preferably 210 times or more as high as that of the deposition gas and 300 times or less as high as that of the deposition gas such that the deposition gas is diluted. The deposition temperature in that case is preferably room temperature to 300° C., far preferably 200° C. to 280° C.

A rare gas such as helium, argon, neon, krypton, or xenon is used as a source gas for the second microcrystalline semiconductor film 109, the crystallinity of the second microcrystalline semiconductor film 109 can be increased as is in the first microcrystalline semiconductor film 107. Accordingly, an on-state current and field-effect mobility of the thin film transistor can be increased and throughput of the thin film transistor can be increased.

The condition used for the first microcrystalline semiconductor film 107 can be employed to generate the glow discharge plasma to form the second microcrystalline semiconductor film 109, as appropriate. The throughput can be improved by using the same condition to generate the glow discharge plasma for the first microcrystalline semiconductor film 107 and the glow discharge plasma for the second microcrystalline semiconductor film 109; however, respective conditions are not necessarily the same as each other.

Film formation of the first microcrystalline semiconductor film 107 and the second microcrystalline semiconductor film 109 is described below using FIGS. 2A and 2B.

Figure 2A:
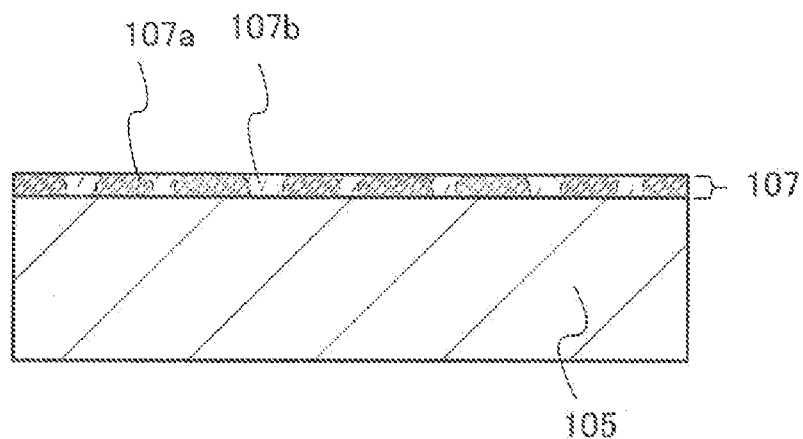
FIGS. 2A and 2B are cross-sectional views illustrating a manufacturing method of a transistor according to an embodiment of the present invention.

FIG. 2A is an enlarged view of the first microcrystalline semiconductor film 107. The first microcrystalline semiconductor film 107, which is formed under the first condition in which a space between crystal grains is filled with an amorphous semiconductor, includes crystal grains 107a and an amorphous semiconductor 107b with which a space between the crystal grains 107a is filled. Therefore, the first microcrystalline semiconductor film 107 includes less space. The crystal grain includes an amorphous semiconductor region and a plurality of crystallites which are minute crystals each of which can be regarded as a single crystal.

Figure 2B:
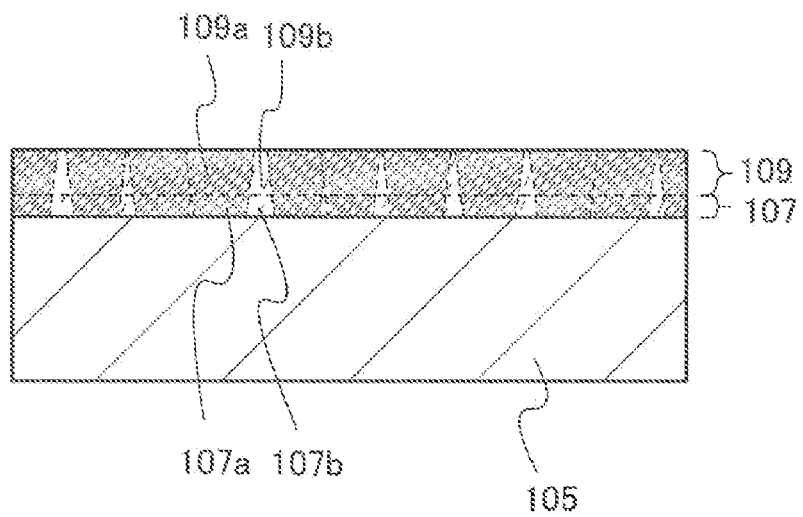

FIG. 2B is an enlarged view of the first microcrystalline semiconductor film 107 and the second microcrystalline semiconductor film 109. The second microcrystalline semiconductor film 109 is formed under the second condition for promoting crystal growth. Therefore, the amorphous semiconductor region in the first microcrystalline semiconductor film 107 is etched and crystal growth proceeds using the crystallite in the crystal grain 107a as a seed crystal, so that crystal grains 109a and an amorphous semiconductor 109b with which a space between the crystal grains 109a is filled are formed. Thus, the ratio of a crystal region to an amorphous semiconductor is increased and the crystallinity is enhanced.

It is preferable that the thickness of the first microcrystalline semiconductor film 107 be greater than or equal to 1 nm and less than or equal to 4 nm. In the bottom-gate thin film transistor, a channel region on the gate insulating film 105 side is formed near the gate insulating film 105. Therefore, the field-effect mobility of the thin film transistor can be increased by forming a microcrystalline semiconductor film having high crystallinity in the channel region. In order to provide the second microcrystalline semiconductor film 109, which has higher crystallinity than the first microcrystalline semiconductor film 107, in a larger area than the first microcrystalline semiconductor film 107 in the channel region on the gate insulating film 105 side, it is preferable that the thickness of the first microcrystalline semiconductor film 107 be less than or equal to 4 nm. On the other hand, since the first microcrystalline semiconductor film 107 needs to include the crystal grains and the amorphous semiconductor with which a space between the crystal grains is filled, it is preferable that the thickness of the first microcrystalline semiconductor film 107 be greater than or equal to 1 nm.

It is preferable that the thickness of the second microcrystalline semiconductor film 109 be greater than or equal to 30 nm and less than or equal to 100 nm. The thickness of the second microcrystalline semiconductor film 109 which is greater than or equal to 30 nm enables variations of electrical characteristics of the thin film transistor to be suppressed; and the thickness of the second microcrystalline semiconductor film 109 which is less than or equal to 100 nm enables throughput to be increased.

A relationship between the flow rate ratio of hydrogen to the deposition gas containing silicon or germanium and the field-effect mobility of the thin film transistor is described below using FIG. 3.

Figure 3:
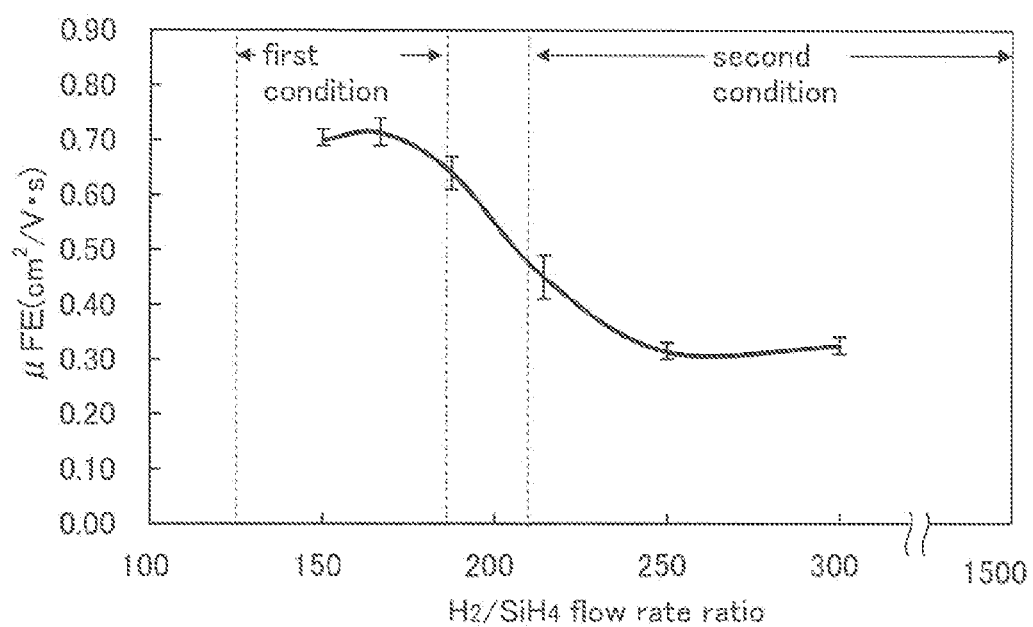
FIG. 3 is a graph for describing a manufacturing method of a transistor according to an embodiment of the present invention.

FIG. 3 is a graph illustrating the relationship between the flow rate ratio of hydrogen to silane which is a source gas of a microcrystalline semiconductor film and the field-effect mobility of a thin film transistor formed using the microcrystalline semiconductor film. In FIG. 3, as the flow rate ratio of hydrogen to silane increases, the field-effect mobility of the thin film transistor decreases. The reason is as follows: as the flow rate ratio of hydrogen to silane increases, the probability of generation of hydrogen radicals is increased, which enhances the etching action on an amorphous semiconductor to etch the amorphous semiconductor between the crystal grains, so that the crystallinity of the microcrystalline semiconductor film is enhanced and a space tends to be formed between the crystal grains; the space functions as a barrier against carrier movement, which causes reduction in the field-effect mobility of the thin film transistor.

To the contrary, as the flow rate ratio of hydrogen to silane decreases, the field-effect mobility of the thin film transistor increases. The reason is as follows: as the flow rate ratio of hydrogen to silane decreases, the probability of generation of hydrogen radicals is decreased, which decreases the etching action, so that the crystallinity of the microcrystalline semiconductor film is decreased and a space between crystal grains is filled with an amorphous semiconductor; thus the carrier movement path becomes continuous, which increases the filed-effect mobility of the thin film transistor. However, if the flow rate ratio of hydrogen to silane is further decreased, the proportion of crystallites contained in the crystal grain becomes so small that the crystallinity of the microcrystalline semiconductor film is decreased, so that an amorphous semiconductor film is formed. Therefore, in the first condition, the flow rate of hydrogen is preferably 125 times or more as high as that of a deposition gas containing silicon or germanium and 180 times or less as high as that of the deposition gas, far preferably 150 times or more as high as that of the deposition gas and 170 times or less as high as that of the deposition gas. Further, in the second condition, in order to promote crystal growth using the crystallite of the crystal grain contained in the microcrystalline semiconductor film formed under the first condition, the flow rate of hydrogen is preferably 210 times or more as high as that of a deposition gas containing silicon or germanium and 1500 times or less as high as that of the deposition gas, far preferably 210 times or more as high as that of the deposition gas and 300 times or less as high as that of the deposition gas.

According to this embodiment, the first microcrystalline semiconductor film 107 and the second microcrystalline semiconductor film 109 are stacked, whereby a microcrystalline semiconductor film having high crystallinity in which a space between crystal grains is very small can be formed.

The first microcrystalline semiconductor film 107 and the second microcrystalline semiconductor film 109 are formed using a microcrystalline semiconductor. The microcrystalline semiconductor is a semiconductor having an intermediate structure between amorphous and crystalline structures (including a single crystal structure and a polycrystalline structure). The microcrystalline semiconductor is a semiconductor having a third state that is stable in terms of free energy and is a crystalline semiconductor having short-range order and lattice distortion, in which a columnar crystal grain or a needle-like crystal grain having a diameter of greater than or equal to 2 nm and less than or equal to 200 nm, preferably greater than or equal to 10 nm and less than or equal to 80 nm, far preferably greater than or equal to 20 nm and less than or equal to 50 nm grows in a normal direction with respect to the substrate surface. Therefore, there is a case where a crystal grain boundary is formed at the interface of the columnar or needle-like crystal grains. The diameter of a crystal grain means a maximum diameter of the crystal grain in a plane parallel to the substrate surface. Further, the crystal grain includes an amorphous semiconductor region and a crystallite which is a minute crystal that can be regarded as a single crystal. The crystal grain may include a twin crystal.

The Raman spectrum of microcrystalline silicon, which is a typical example of a microcrystalline semiconductor, is located in lower wave numbers than 520 cm$^{-1}$ which represents a peak of the Raman spectrum of single crystal silicon. That is, the peak of the Raman spectrum of the microcrystalline silicon is positioned between 520 cm$^{-1}$ which represents single crystal silicon and 480 cm$^{-1}$ which represents amorphous silicon. The microcrystalline semiconductor includes at least 1 at. % or more of hydrogen or halogen to terminate a dangling bond. Moreover, the microcrystalline semiconductor may contain a rare gas element such as helium, argon, krypton, or neon to further promote lattice distortion, so that stability is increased and a favorable microcrystalline semiconductor can be obtained. Description on such a microcrystalline semiconductor has been made in U.S. Pat. No. 4,409,134.

The microcrystalline semiconductor includes a plurality of crystal grains and the crystal grain includes an amorphous semiconductor region and a plurality of crystallites which are minute crystals each of which can be regarded as a single crystal. The size of the crystallite in the crystal grain can be increased according to the method for forming the first microcrystalline semiconductor film 107 and the second microcrystalline semiconductor film 109 described in this embodiment, leading to increase in the crystallinity of the microcrystalline semiconductor.

Figure 1C:
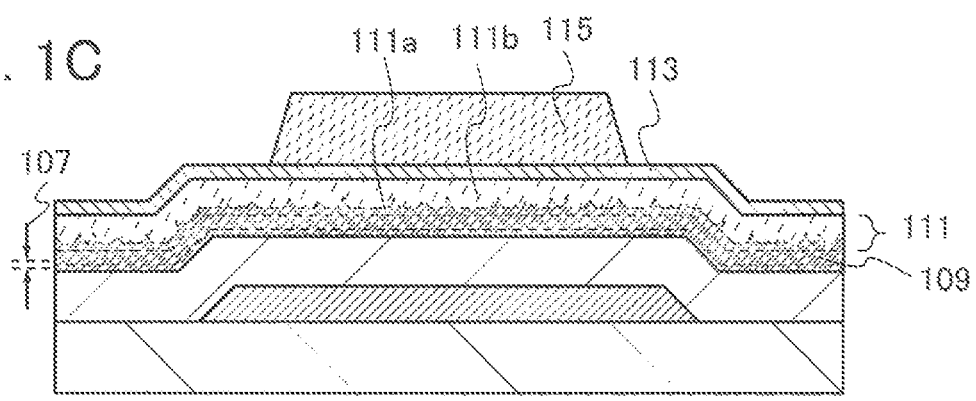
Figure 1D:
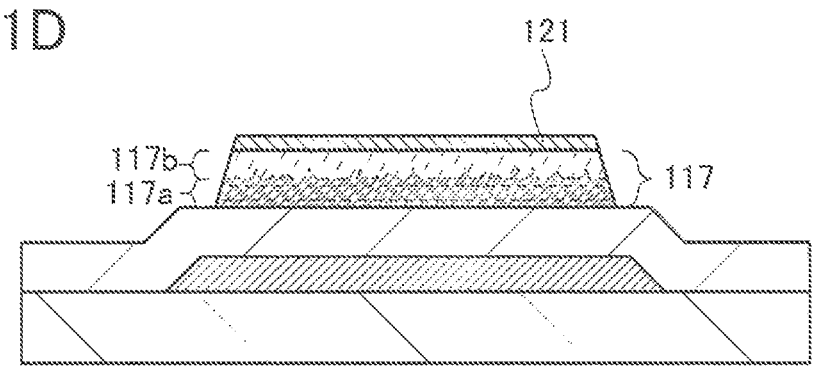

Next, as shown in FIG. 1C, a semiconductor film 111 is formed over the second microcrystalline semiconductor film 109. The semiconductor film 111 includes a microcrystalline semiconductor region 111a and an amorphous semiconductor region 111b. Next, a first impurity semiconductor film (referred to as an impurity semiconductor film 113) is formed over the semiconductor film 111. Then, a resist mask 115 is formed over the impurity semiconductor film 113.

The semiconductor film 111 including the microcrystalline semiconductor region 111a and the amorphous semiconductor region 111b can be formed on such a condition that crystal growth is partly conducted (the crystal growth is reduced) with the use of the second microcrystalline semiconductor film 109 as a seed crystal.

The semiconductor film 111 is formed by glow discharge plasma with the use of a mixture of hydrogen, a gas containing nitrogen, and a deposition gas containing silicon or germanium in a process chamber of a plasma CVD apparatus. Examples of the gas containing nitrogen include ammonia, nitrogen, nitrogen fluoride, nitrogen chloride, chloroamine, fluoroamine, and the like. Glow discharge plasma can be generated as in the case of the first microcrystalline semiconductor film 107.

In that case, the flow ratio of the deposition gas containing silicon or germanium to hydrogen is the same as that for forming a microcrystalline semiconductor film like the first microcrystalline semiconductor film 107 or the second microcrystalline semiconductor film 109, and the gas containing nitrogen is used as a source gas, whereby the degree of crystal growth can be suppressed as compared to that on either deposition condition for the first microcrystalline semiconductor film 107 or the second microcrystalline semiconductor film 109. Specifically, at an early stage of deposition of the semiconductor film 111, the gas containing nitrogen included in the source gas partly suppresses the crystal growth, so that a conical microcrystalline semiconductor region or a pyramidal microcrystalline semiconductor region grows and an amorphous semiconductor region is formed. Further, at a middle stage or a later stage of the deposition, crystal growth in the conical or pyramidal microcrystalline semiconductor region stops, and is followed by deposition of only the amorphous semiconductor region. Accordingly, in the semiconductor film 111, the microcrystalline semiconductor region 111a and the amorphous semiconductor region 111b which is formed using a well-ordered semiconductor film having fewer defects and a steep tail of a level at a band edge in the valence band, can be formed.

In this embodiment, a typical example of the condition for forming the semiconductor film 111 is as follows: the flow rate of hydrogen is 10 to 2000 times, preferably 10 to 200 times as high as that of the deposition gas containing silicon or germanium. Note that in a typical example of a condition for forming a normal amorphous semiconductor film, the flow rate of hydrogen is 0 to 5 times as high as that of the deposition gas containing silicon or germanium.

A rare gas such as helium, neon, argon, krypton, or xenon may be introduced into the source gas of the semiconductor film 111, so that the deposition rate can be increased.

It is preferable that the thickness of the semiconductor film 111 be 50 nm to 350 nm, far preferably 120 nm to 250 nm.

Figure 4A:
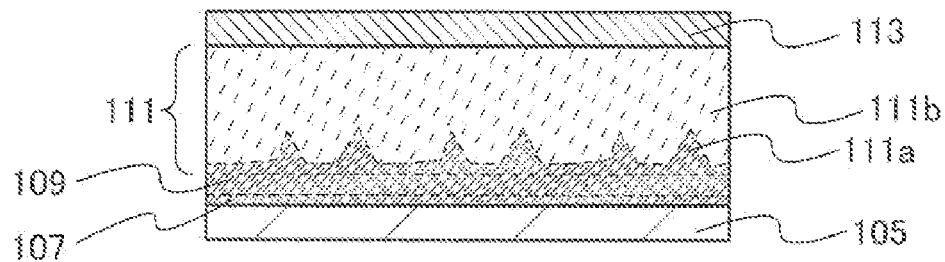
FIGS. 4A and 4B are cross-sectional views illustrating a manufacturing method of a transistor according to an embodiment of the present invention.
Figure 4B:

FIGS. 4A and 4B are enlarged views of the portion between the gate insulating film 105 and the impurity semiconductor film 113 shown in FIG. 1C.

As shown in FIG. 4A, the microcrystalline semiconductor region 111a in the semiconductor film 111 has a projection and/or a depression; the microcrystalline semiconductor region 111a has a projecting (conical or pyramidal) shape whose width decreases from the gate insulating film 105 toward the amorphous semiconductor region 111b (a tip of the projected portion has an acute angle). Alternatively, the microcrystalline semiconductor region 111a may have a projecting (inverted conical or pyramidal) shape whose width increases from the gate insulating film 105 toward the amorphous semiconductor region 111b.

The thickness of the microcrystalline semiconductor region 111a, that is, the distance from the interface between the microcrystalline semiconductor region 111a and the second microcrystalline semiconductor film 109 to the tip of the projection of the microcrystalline semiconductor region 111a may be set to greater than or equal to 5 nm and less than or equal to 310 nm, so that the off-state current of the thin film transistor can be reduced.

Further, in order to improve the crystallinity of the microcrystalline semiconductor region 111a, it is preferable that the concentrations of oxygen and nitrogen contained in the semiconductor film 111, which are measured by secondary ion mass spectrometry, be less than $1 \times 10^{18}$ atoms/cm$^3$.

The amorphous semiconductor region 111b is formed using an amorphous semiconductor containing nitrogen. Nitrogen of the amorphous semiconductor containing nitrogen may exist, for example, as an NH group or an NH₂ group. The amorphous semiconductor is formed using amorphous silicon.

The amorphous semiconductor containing nitrogen is a semiconductor having a less amount of the defect absorption spectrum and lower energy at an Urbach edge, measured by a constant photocurrent method (CPM) or photoluminescence spectroscopy, compared to a conventional amorphous semiconductor. That is, as compared to the conventional amorphous semiconductor, the amorphous semiconductor containing nitrogen is a well-ordered semiconductor which has few defects and whose tail of a level at a band edge in the valence band is steep. Furthermore, since the amorphous semiconductor containing nitrogen has a steep tail of a level at a band edge in the valence band, the band gap gets wider and less tunneling current flows. Therefore, the amorphous semiconductor containing nitrogen is provided between the microcrystalline semiconductor region 111a and the impurity semiconductor film 113, whereby the off-state current of the thin film transistor can be reduced. In addition, by providing the amorphous semiconductor containing nitrogen, the on-state current and the field-effect mobility can be increased.

Further, the peak region of a spectrum of the amorphous semiconductor containing nitrogen, obtained by performing low-temperature photoluminescence spectroscopy is greater than or equal to 1.31 eV and less than or equal to 1.39 eV. Note that the peak of a spectrum of a microcrystalline semiconductor, typically microcrystalline silicon, obtained by performing low-temperature photoluminescence spectroscopy is greater than or equal to 0.98 eV and less than or equal to 1.02 eV. Therefore, the amorphous semiconductor containing nitrogen is different from a microcrystalline semiconductor.

Further, in addition to the amorphous semiconductor region 111b, the microcrystalline semiconductor region 111a may also contain an NH group or an NH₂ group.

Further, as shown in FIG. 4B, a semiconductor crystal grain 111c whose grain size is greater than or equal to 1 nm and less than or equal to 10 nm, preferably greater than or equal to 1 nm and less than or equal to 5 nm may be included in the amorphous semiconductor region 111b, so that the on-state current and the filed-effect mobility can be further increased.

The microcrystalline semiconductor having a projected (conical or pyramidal) shape whose width decreases from the gate insulating film 105 toward the amorphous semiconductor region 111b or the microcrystalline semiconductor having a projected shape whose width increases from the gate insulating film 105 toward the amorphous semiconductor region 111b is formed in the following manner: after the second microcrystalline semiconductor film is formed under the condition for depositing a microcrystalline semiconductor, crystal growth is performed on such a condition that the crystal grow is gradually reduced, and an amorphous semiconductor is deposited.

Since the microcrystalline semiconductor region 111a of the semiconductor film 111 has the conical or pyramidal shape or the inverted conical or pyramidal shape, resistance in the vertical direction (film thickness direction) of when voltage is applied between the source and drain electrodes in an on state, i.e., resistance of the semiconductor film 111 can be reduced. Further, less tunneling current flows by the provision of the amorphous semiconductor containing nitrogen between the microcrystalline semiconductor region 111a and the impurity semiconductor film 113 because the amorphous semiconductor is a well-ordered semiconductor which has fewer defects and whose tail of a level at a band edge in the valence band is steep. In this manner, in the thin film transistor described in this embodiment, the on-state current and the field-effect mobility can be increased and the off-state current can be reduced.

In this embodiment, the semiconductor film 111 including the microcrystalline semiconductor region 111a and the amorphous semiconductor region 111b is formed using the source gas including the gas containing nitrogen. Alternatively, the semiconductor film 111 may be formed in the following manner: the top surface of the second microcrystalline semiconductor film 109 is exposed to a gas containing nitrogen so that nitrogen is adsorbed to the top surface of the second microcrystalline semiconductor film 109; and then film deposition is performed using a deposition gas including silicon or germanium and hydrogen as a source gas.

The impurity semiconductor film 113 is formed using amorphous silicon to which phosphorus is added, microcrystalline silicon to which phosphorus is added, or the like. Amorphous silicon to which phosphorus is added and microcrystalline silicon to which phosphorus is added may be stacked. In the case of forming a p-channel thin film transistor as a thin film transistor, the impurity semiconductor film 113 is formed using microcrystalline silicon to which boron is added, amorphous silicon to which boron is added, or the like. In the case where the semiconductor film 111 achieves an ohmic contact with wirings 129a and 129b, the impurity semiconductor film 113 is not necessarily formed.

The impurity semiconductor film 113 is formed by glow discharge plasma with the use of a mixture of hydrogen, phosphine (diluted with hydrogen or silane), and a deposition gas containing silicon in a reaction chamber of the plasma CVD apparatus. Amorphous silicon to which phosphorus is added or microcrystalline silicon to which phosphorus is added is formed by diluting the deposition gas containing silicon with hydrogen. In the case of forming a p-channel thin film transistor, the impurity semiconductor film 113 may be formed by glow discharge plasma using diborane instead of phosphine.

In the case where the impurity semiconductor film 113 is formed using amorphous silicon to which phosphorus is added or microcrystalline silicon to which boron is added, a microcrystalline semiconductor film, typically a microcrystalline silicon film may be formed between the semiconductor film 111 and the impurity semiconductor film 113, so that characteristics of the interface can be improved. Accordingly, the resistance in the interface between the impurity semiconductor film 113 and the semiconductor film 111 can be suppressed. Consequently, the amount of current flowing through the source region, the semiconductor film, and the drain region of the thin film transistor can be increased, which enables increase in the on-state current and the field-effect mobility.

The resist mask 115 can be formed by a photolithography step.

Next, the first microcrystalline semiconductor film 107, the second microcrystalline semiconductor film 109, the semiconductor film 111, and the impurity semiconductor film 113 are etched using the resist mask 115. Through this step, the first microcrystalline semiconductor film 107, the second microcrystalline semiconductor film 109, the semiconductor film 111, and the impurity semiconductor film 113 are separated per pixel, so that an island-shaped first semiconductor stack (referred to as a semiconductor stack 117) and an island-shaped second impurity semiconductor film (referred to as an impurity semiconductor film 121) are formed. The semiconductor stack 117 is respective parts of the first microcrystalline semiconductor film 107, the second microcrystalline semiconductor film 109, and the semiconductor film 111, and includes a microcrystalline semiconductor region 117*a* including respective parts of the first microcrystalline semiconductor film 107, the second microcrystalline semiconductor film 109, and the microcrystalline semiconductor region of the semiconductor film 111, and an amorphous semiconductor region 117*b* including respective parts of the first microcrystalline semiconductor film 107, the second microcrystalline semiconductor film 109, and the amorphous semiconductor region of the semiconductor film 111. Then, the resist mask 115 was removed (see FIG. 1D).

Figure 5A:
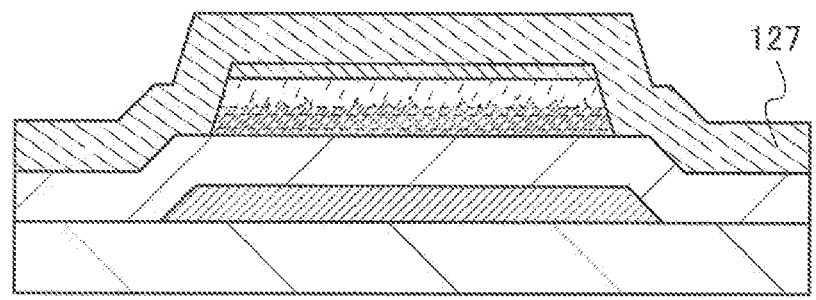
FIGS. 5A to 5C are cross-sectional views illustrating a manufacturing method of a transistor according to an embodiment of the present invention.

Next, a conductive film 127 is formed over the impurity semiconductor film 121 (see FIG. 5A). The conductive film 127 can be formed as a single layer or a stacked layer using aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode 103) may be used as well. Crystalline silicon to which an impurity element which serves as a donor is added may be used as well. Then, a stacked-layer structure in which a film on the side that is in contact with the crystalline silicon to which an impurity element serving as a donor is added is formed using titanium, tantalum, molybdenum, tungsten, or nitride of any of these elements, and a layer of aluminum or an aluminum alloy is formed thereover may be formed. Further alternatively, a stacked-layer structure in which an upper side and a lower side of aluminum or an aluminum alloy is sandwiched by titanium, tantalum, molybdenum, tungsten, or nitride of any of these elements may be formed. The conductive film 127 is formed by a CVD method, a sputtering method, or a vacuum evaporation method. Alternatively, the conductive film 127 may be formed by discharging a conductive nanopaste of silver, gold, copper, or the like by a screen printing method, an ink-jet method, or the like and baking the conductive nanopaste.

Next, a resist mask is formed by a photolithography step, and the conductive film 127 is etched with the use of the resist mask, to form the wirings 129*a* and 129*b* functioning as a source electrode and a drain electrode (see FIG. 5B), The etching of the conductive film 127 may be either dry etching or wet etching. One of the wirings 129*a* and 129*b* functions not only as the source electrode or the drain electrode but also as a signal line. However, without limitation thereto, a signal line may be provided separately from the source and drain electrodes.

Next, the impurity semiconductor film 121 and part of the semiconductor stack 117 are etched, so that a pair of impurity semiconductor films 131*a* and 131*b* functioning as a source region and a drain region and a semiconductor stack 133 including a microcrystalline semiconductor region 133*a* and a pair of amorphous semiconductor regions 133*b* are formed. The etching of the semiconductor stack 117 is performed so that the microcrystalline semiconductor region 133*a* is exposed, whereby the semiconductor stack 133 is formed in which the microcrystalline semiconductor region 133*a* and the amorphous semiconductor region 133*b* are stacked in a region which is covered with the wiring 129*a*, 129*b*, and the microcrystalline semiconductor region 133*a* is exposed in a region which is not covered with the wiring 129*a*, 129*b* but overlaps with the gate electrode.

Dry etching is used in the etching, so that the end of the wiring 129*a*, 129*b* is aligned with the end of the impurity semiconductor film 131*a*, 131*b*. However, when the conductive 127 is etched by wet etching and the impurity semiconductor film 121 is etched by dry etching, the end of the wiring 129*a*, 129*b* is deviated from the end of the impurity semiconductor film 131*a*, 131*b*, so that in a cross section with respect to the substrate surface, the end of the wiring 129*a*, 129*b* is positioned on the inner side than the end of the impurity semiconductor film 131*a*, 131*b*.

Dry etching may be further performed in addition to the etching step. The dry etching is performed with a low etching rate of the microcrystalline semiconductor region 133*a* and the amorphous semiconductor region 133*b* so that the exposed microcrystalline semiconductor region 133*a* and the exposed amorphous semiconductor region 133*b* are not damaged. In other words, such a condition that almost no damage is given to the exposed surfaces of the microcrystalline semiconductor region 133*a* and the amorphous semiconductor region 133*b* and the thicknesses of the exposed microcrystalline semiconductor region 133*a* and the exposed amorphous semiconductor region 133*b* are hardly reduced. As an etching gas, $Cl_2$, $CF_4$, $N_2$, or the like is typically used. There is no particular limitation on an etching method; an inductively coupled plasma (ICP) method, a capacitively coupled plasma (CCP) method, an electron cyclotron resonance (ECR) method, a reactive ion etching (RIE) method, or the like can be used.

Next, the surfaces of the microcrystalline semiconductor region 133*a* and the amorphous semiconductor region 133*b* are subjected to plasma treatment, typically, water plasma treatment, oxygen plasma treatment, ammonia plasma treatment, nitrogen plasma treatment, or the like.

The water plasma treatment can be performed by generating plasma using a gas containing water as its main component typified by water vapor ($H_2O$ vapor), introduced into a reaction space. After that, the resist mask is removed. The resist mask may be removed before the dry etching on the impurity semiconductor film 121 and the semiconductor stack 117.

As described above, after the microcrystalline semiconductor region 133*a* and the amorphous semiconductor region 133*b* are formed, the dry etching is further performed under the condition that no damage is given to the microcrystalline semiconductor region 133*a* and the amorphous semiconductor region 133*b*, whereby impurity such as a residue existing on the exposed microcrystalline semiconductor region 133*a* and the amorphous semiconductor region 133*b* can be removed. Further, the water plasma treatment follows the dry etching to be performed, whereby a residue of the resist mask can be removed and a defect of the microcrystalline semiconductor region 133*a* can be reduced. Moreover, by the above plasma treatment, insulation between the source region and the drain region can be ensured, and thus, the off-state current of the thin film transistor can be reduced, and variation in electric characteristics can be reduced.

Through the above-described process, a single-gate thin film transistor with a channel region formed using a microcrystalline semiconductor film can be formed. Further, a single-gate thin film transistor with low off-state current, high on-state current, and high field-effect mobility can be manufactured with high productivity.

Next, an insulating film 137 (also referred to as a second gate insulating film) is formed. The insulating film 137 can be formed in a manner similar to that for the gate insulating film 105.

Next, an opening (not shown) is formed in the insulating film 137 with the use of a resist mask formed by a photolithography step. Next, a back-gate electrode 139 (also referred to as a second gate electrode) is formed (see FIG. 5C).

The back-gate electrode 139 can be formed in a manner similar to that of the wirings 129*a* and 129*b*. Further, the back-gate electrode 139 can be formed using a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added.

Alternatively, the back-gate electrode 139 can be formed using a conductive composition containing a light-transmitting conductive polymer. The back-gate electrode 139 preferably has a sheet resistivity of less than or equal to 10000 ohms/square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive high molecule can be used. For example, polyaniline or a derivative thereof, polypyrrole or a derivative thereof, polythiophene or a derivative thereof, or a copolymer of two or more of polyaniline, polypyrrole, and polythiophene or a derivative thereof can be given.

The back-gate electrode 139 can be formed in the following manner: a thin film is formed using the material described above by a sputtering method; and the thin film is etched using a resist mask that is formed by a photolithography step. Alternatively, a conductive composition including a conductive high molecule having a light-transmitting property is applied or printed, and baked to form the back-gate electrode 139.

Next, a form of the back-gate electrode is described with reference to FIGS. 6A to 6D that are top views of thin film transistors.

Figure 6A:
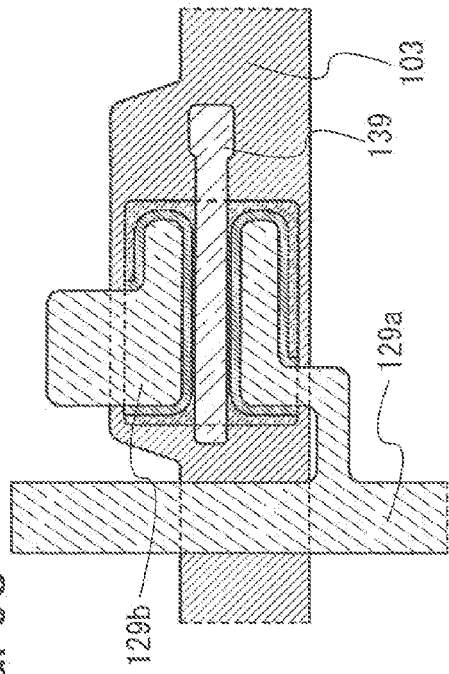
FIGS. 6A to 6D are top views illustrating a manufacturing method of a transistor according to an embodiment of the present invention.

As shown in FIG. 6A, the back-gate electrode 139 can be formed in parallel to the gate electrode 103 when seen from the above. In that case, potentials applied to the back-gate electrode 139 and the gate electrode 103 can be controlled separately. Thus, the threshold voltage of the thin film transistor can be controlled. Further, regions in which carriers flow, that is, channel regions, are formed on the gate insulating film 105 side and on the insulating film 137 side in the microcrystalline semiconductor region; thus, the on-state current of the thin film transistor can be increased.

Figure 6B:
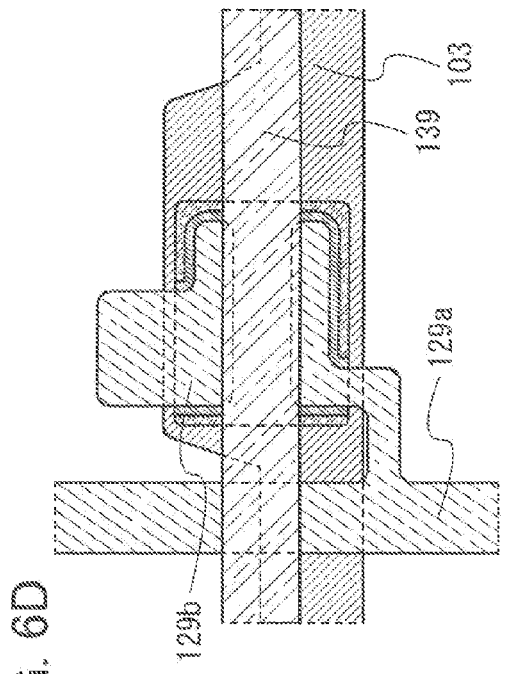

As shown in FIG. 6B, the back-gate electrode 139 can be connected to the gate electrode 103. That is, the gate electrode 103 and the back-gate electrode 139 can be connected through an opening 150 formed in the gate insulating film 105 and the insulating film 137. In that case, potential applied to the back-gate electrode 139 is equal to potential applied to the gate electrode 103. As a result, in the microcrystalline semiconductor region in the semiconductor layer, regions in which carriers flow, that is, channel regions are formed on the gate insulating film 105 side and on the insulating film 137 side; thus, the on-state current of the thin film transistor can be increased.

Figure 6C:
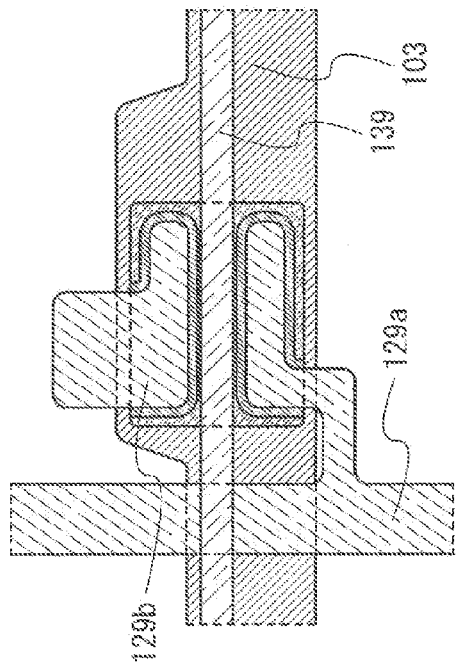

Further alternatively, as shown in FIG. 6C, the back-gate electrode 139 is not necessarily connected to the gate electrode 103 but may be in a floating state. In that case, channel regions are formed on the gate insulating film 105 side and on the insulating film 137 side in the microcrystalline semiconductor region without applying potential to the back-gate electrode 139; thus, the on-state current of the thin film transistor can be increased.

Figure 6D:
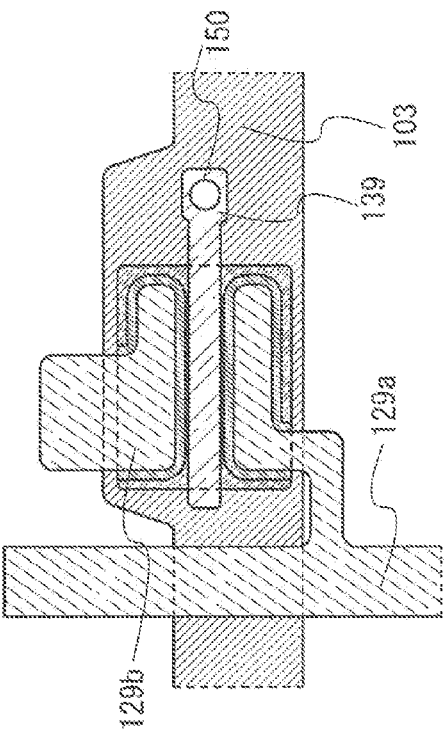

As shown in FIG. 6D, the back-gate electrode 139 may overlap with the wirings 129a and 129b with the insulating film 137 provided therebetween. Although FIG. 6D illustrates the case using the back-gate electrode 139 shown in FIG. 6A, the back-gate electrode 139 of FIG. 6B or FIG. 6C may be made to overlap with the wirings 129a and 129b as well.

In the dual-gate thin film transistor described in this embodiment, two channel regions where carriers flow are formed in the vicinity of the interface between the microcrystalline semiconductor region 133a and the gate insulating film 105 and in the vicinity of the interface between the microcrystalline semiconductor region 133a and the insulating film 137. The region in the microcrystalline semiconductor film on the gate insulating film 105 side is formed using crystal grains and an amorphous semiconductor with a space between the crystal grains is filled; the region in the microcrystalline semiconductor film on the insulating film 137 side is formed using a microcrystalline semiconductor with high crystallinity. Further, since the space between crystal grains in the microcrystalline semiconductor film can be reduced and the crystallinity can be increased, the move amount of carriers is increased, so that the on-state current and the field-effect mobility can be increased. Furthermore, since the amorphous semiconductor region 133b is provided between the microcrystalline semiconductor region 133a and the impurity semiconductor film 131a, 131b, the off-state current of the thin film transistor can be reduced. Accordingly, the area of the thin film transistor can be reduced, which enables high integration into a semiconductor device. Further, by using the thin film transistor described in this embodiment for a driver circuit of a display device, the size of the driver circuit can be decreased, which enables the frame size of the display device to be decreased.

(Embodiment 2)

In Embodiment 2, a method for manufacturing a thin film transistor, by which the off-state current can be further reduced as compared to Embodiment 1 will be described with reference to FIGS. 1A to 1D and FIGS. 7A to 7C.

Figure 7A:
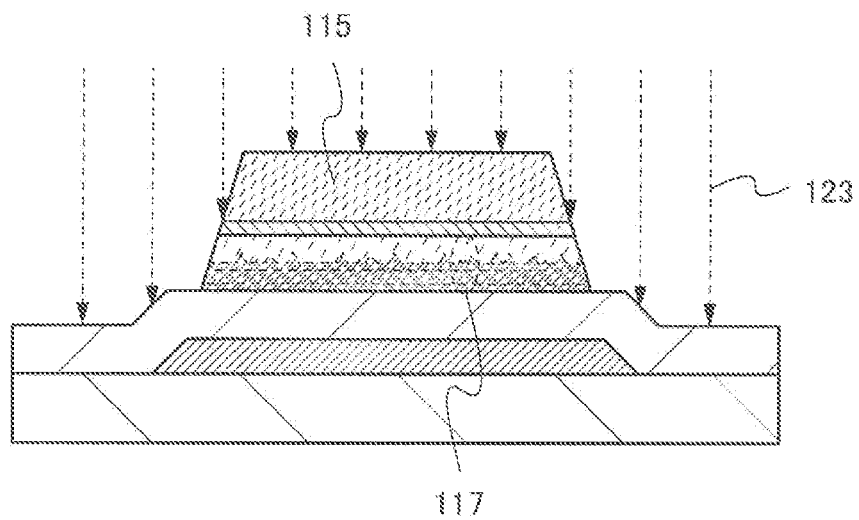
FIGS. 7A to 7C are cross-sectional views illustrating a manufacturing method of a transistor according to an embodiment of the present invention.

In a similar matter to Embodiment 1, the semiconductor stack 117 as shown in FIG. 7A is formed through the process shown in FIGS. 1A to 1C.

Next, plasma treatment is performed in which the side surface of the semiconductor stack 117 is exposed to plasma 123 with the resist mask 115 left. In Embodiment 2, plasma is generated in an oxidation gas atmosphere or a nitriding gas atmosphere, and the semiconductor stack 117 is exposed to the plasma 123. Examples of the oxidation gas include oxygen, ozone, dinitrogen monoxide, water vapor, a mixed gas of oxygen and hydrogen, and the like. Examples of the nitriding gas include nitrogen, ammonia, nitrogen fluoride, nitrogen chloride, chloroamine, fluoroamine, and the like. Plasma generation in the oxidation gas atmosphere or the nitriding gas atmosphere causes an oxygen radical or a nitrogen radical to be generated. The radical reacts with the semiconductor stack 117, which forms an insulating region functioning as a bank region on the side surface of the semiconductor stack 117. Instead of the irradiation with plasma, irradiation with ultraviolet light may be employed to generate an oxygen radical or a nitrogen radical.

Figure 7B:
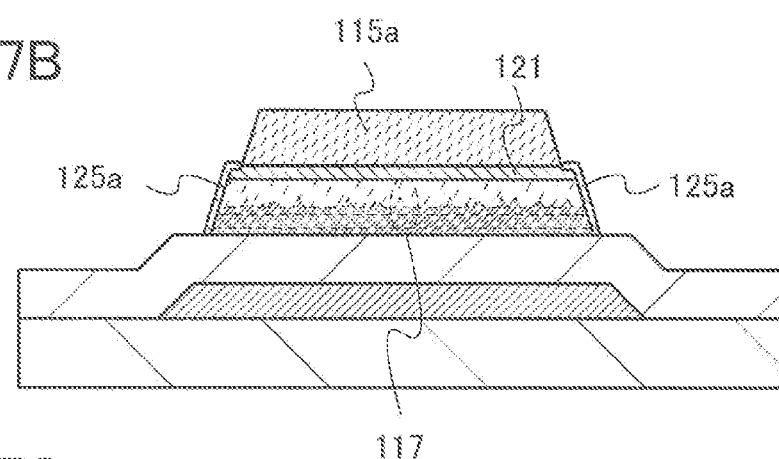

In the case of using oxygen, ozone, water vapor, or a mixed gas of oxygen and hydrogen as the oxidation gas, the resist recedes by plasma irradiation, so that a resist mask 115a which is smaller than the resist mask 115 is formed as shown in FIG. 7B. Therefore, by the plasma treatment, the exposed impurity semiconductor film 121 is oxidized together with the side wall of the semiconductor stack 117, so that an insulating region 125a functioning as a bank region is formed on the side wall and part of the top surface of the impurity semiconductor film 121 and the side wall of the semiconductor stack 117.

Figure 5B:
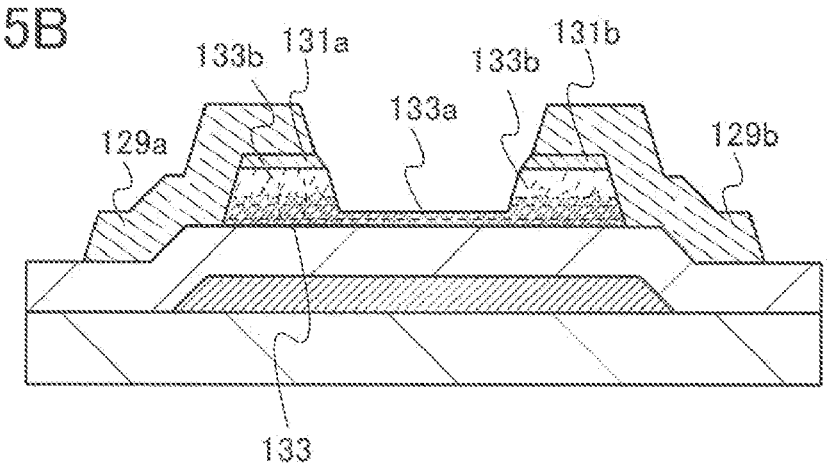

Next, as described in Embodiment 1, through in the process shown in FIGS. 5A and 5B, the wirings 129a and 129b functioning as a source electrode and a drain electrode, the pair of impurity semiconductor films 131a and 131b functioning as a source region and a drain region, and the semiconductor stack 133 including the microcrystalline semiconductor region 133a and the pair of amorphous semiconductor regions 133b are formed.

Figure 5C:
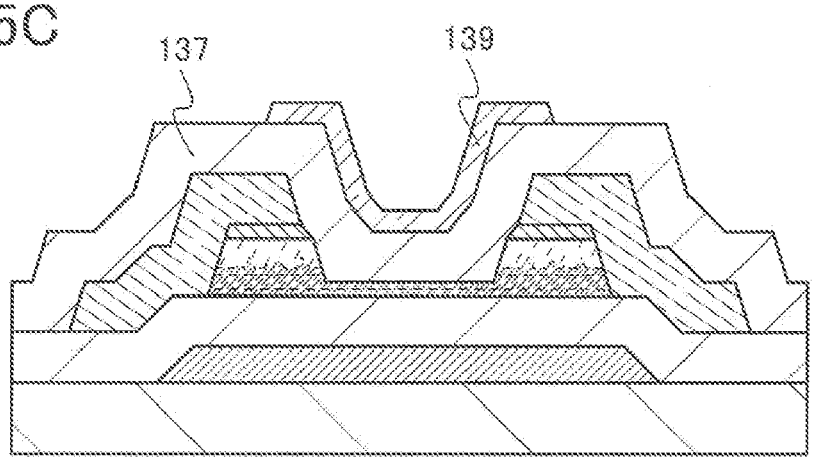
Figure 7C:
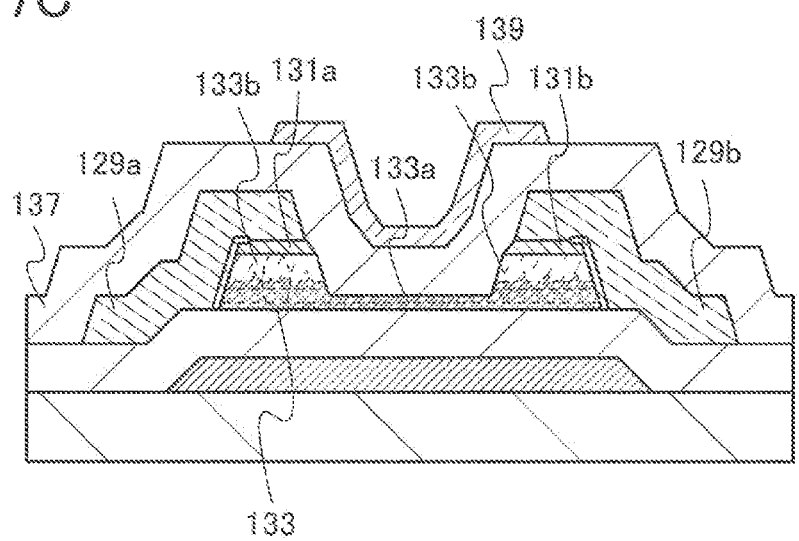

Next, though the step shown in FIG. 5C described in Embodiment 1, the insulating film 137 and the back-gate electrode 139 are formed (see FIG. 7C).

Through the above steps, a dual-gate thin film transistor can be formed. In the dual-gate thin film transistor described in this embodiment, two channel regions where carriers flow are formed in the vicinity of the interface between the microcrystalline semiconductor region 133a and the gate insulating film 105 and in the vicinity of the interface between the microcrystalline semiconductor region 133a and the insulating film 137, so that the on-state current and the field-effect mobility can be increased. Furthermore, since the insulating region which is a bank region is provided between the semiconductor stack 133 and the wiring 129a, 129b, holes injected from the wirings 129a and 129b to the semiconductor stack 133 can be reduced, so that the off-state current of the thin film transistor is reduced and the on-state current and the field-effect mobility are increased. Accordingly, the area of the thin film transistor can be reduced, which enables high integration into a semiconductor device. Further, by using the thin film transistor described in this embodiment for a driver circuit of a display device, the size of the driver circuit can be decreased, which enables the frame size of the display device to be decreased.

(Embodiment 3)

In Embodiment 3, a thin film transistor in which the off-state current can be further reduced as compared to that in the thin film transistor described in Embodiment 1 will be described with reference to FIGS. 8A to 8D.

In a similar manner to Embodiment 1, the process illustrated in FIGS. 1A to 1D and FIG. 5A is carried out, so that the conductive film 127 is formed over the gate insulating film 105 and the semiconductor stack 117. Then, as shown in FIG. 8, a mask 141 is formed using a resist by a photolithography step over the conductive film 127.

Next, as shown in FIG. 8B, the conductive film 127 and the impurity semiconductor film 121 are etched using the mask 141, so that wirings 129a and 129b which function as a source electrode and a drain electrode and a pair of impurity semiconductor films 131a and 131b which function as a source region and a drain region are formed. Further, part of an exposed portion of the amorphous semiconductor region 117b is etched, so that an amorphous semiconductor region 133c is formed.

Next, the mask 141 is removed using a resist stripper as shown in FIG. 8C.

Next, as shown in FIG. 8D, the amorphous semiconductor region 133c and the microcrystalline semiconductor region 117a are etched using the wirings 129a and 129b as masks, so that a semiconductor stack 133 including a microcrystalline semiconductor region 133a and a pair of amorphous semiconductor regions 133b is formed.

According to the process in this embodiment, since the microcrystalline semiconductor region 133a is covered with the amorphous semiconductor region 133c in the step of removing the mask 141, the microcrystalline semiconductor region 133a is prevented from being in contact with the resist stripper and a residue of the resist. Further, since the amorphous semiconductor region 133c is etched using the wirings 129a and 129b to expose a part of the microcrystalline semiconductor region 133a after the mask 141 is removed, the amorphous semiconductor region which is in contact with the resist stripper and a residue of the resist is not left in a back channel. Consequently, a leak current due to a resist stripper and a residue of a resist left in a back channel are not generated, which can further reduce the off-state current of the thin film transistor.

Although the description is made using Embodiment 1 in this embodiment, Embodiment 2 can be used as appropriate.

(Embodiment 4)

A thin film transistor can be formed, and a semiconductor device having a display function (also referred to as a display device) can be manufactured using the thin film transistor in a pixel portion and further in a driver circuit. Further, part or whole of the driver circuit including the thin film transistor can be formed over the same substrate as the pixel portion, whereby a system-on-panel can be realized.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC and the like including a controller are mounted on the panel. Furthermore, an element substrate, which corresponds to one embodiment before the display element is completed in a manufacturing process of the display device, is provided with a component for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other state.

The display device means an image display device, a display device, or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

(Embodiment 5)

A semiconductor device disclosed in this specification can be applied to electronic paper. An electronic paper can be used for electronic devices of a variety of fields as long as they can display data. For example, electronic paper can be applied to an electronic book (e-book) reader, a poster, an advertisement in a vehicle such as a train, a digital signage, a public information display (PID), displays of various cards such as a credit card, and the like. An example of the electronic device is illustrated in FIG. 9.

Figure 9:
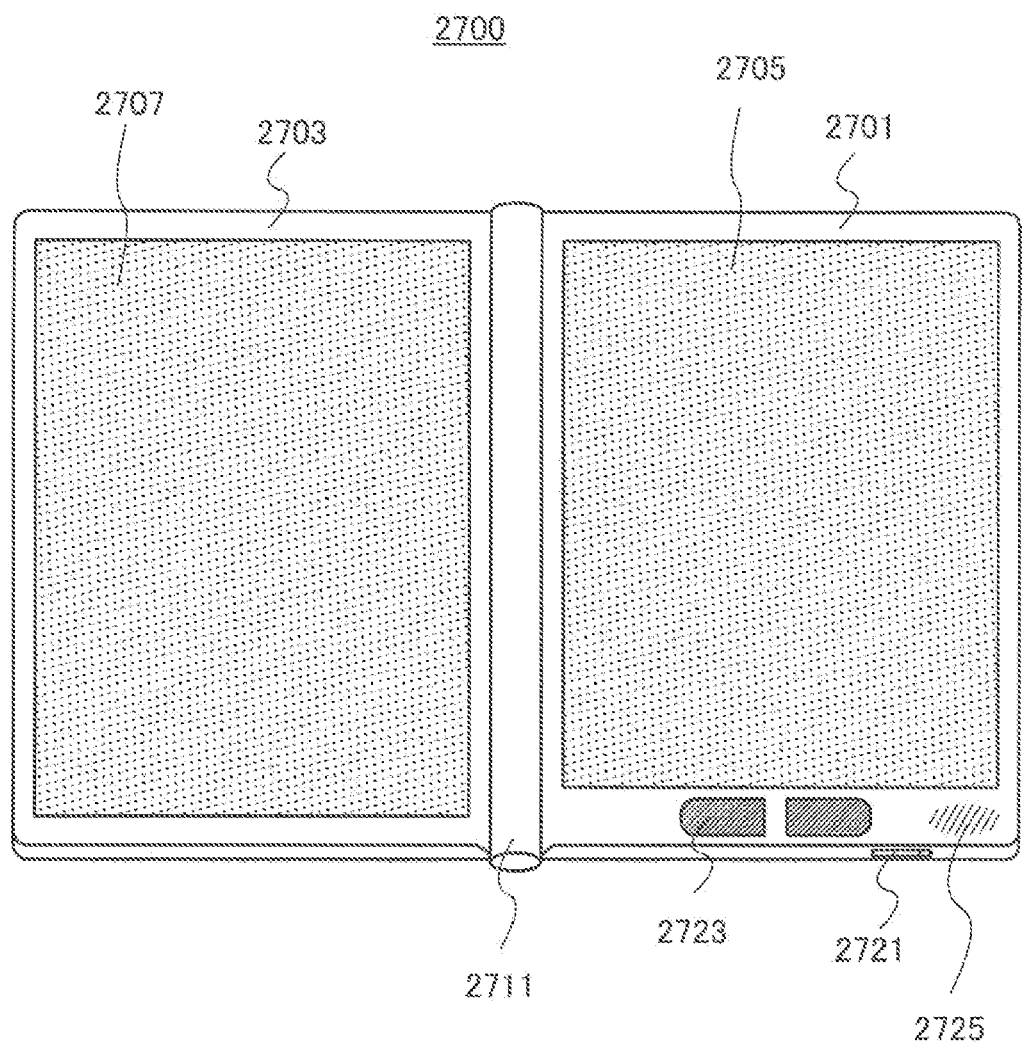
FIG. 9 is an external view illustrating an example of an electronic book.

FIG. 9 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis.

With such a structure, the electronic book reader 2700 can operate like a paper book.

A display portion 2705 and a display portion 2707 are incorporated in the housing 2701 and the housing 2703, respectively. The display portion 2705 and the display portion

2707 may display one image or different images. According to the structure where different images are displayed in different display portions, for example, text can be displayed on the right display portion (the display portion 2705 in FIG. 9) and images can be displayed on the left display portion (the display portion 2707 in FIG. 9).

FIG. 9 illustrates an example in which the housing 2701 is provided with an operation portion and the like. For example, the housing 2701 is provided with a power switch 2721, an operation key 2723, a speaker 2725, and the like. With the operation key 2723, pages can be turned. A keyboard, a pointing device, or the like may also be provided for the surface of the housing, on which the display portion is provided. Further, an external connection terminal (an earphone terminal, a USB terminal, a terminal that can be connected to various cables such as an AC adapter and a USB cable, or the like), a recording medium insertion portion, and the like may be provided for the back surface or the side surface of the housing. Moreover, the electronic book reader 2700 may have a function of an electronic dictionary.

The electronic book reader 2700 may have a structure capable of wirelessly transmitting and receiving data. Through wireless communication, book data or the like can be purchased and downloaded from an electronic book server.

(Embodiment 6)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 10A:
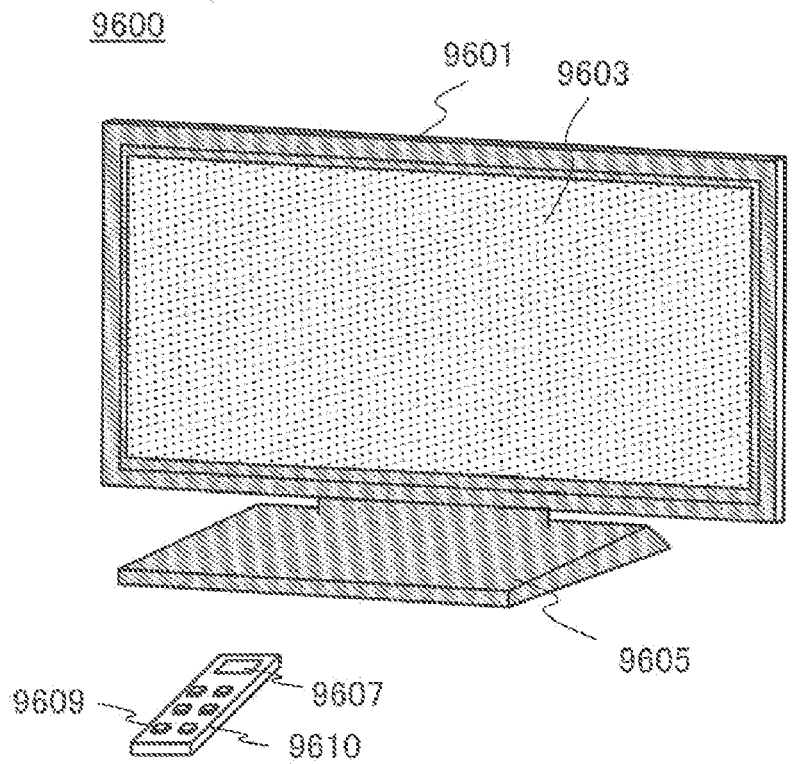
FIGS. 10A and 10B are external views of examples of a television device and a digital photo frame, respectively.

FIG. 10A illustrates an example of a television device. In a television device 9600, a display portion 9603 is incorporated in a housing 9601. The display portion 9603 can display images. In FIG. 10A, the housing 9601 is supported by a stand 9605.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

The television device 9600 is provided with a receiver, a modem, and the like. With the use of the receiver, general television broadcasting can be received. Moreover, the display device may be connected to a communication network with or without wires via the modem, whereby one-way (from sender to receiver) or two-way (between sender and receiver or between receivers) information communication can be performed.

Figure 10B:
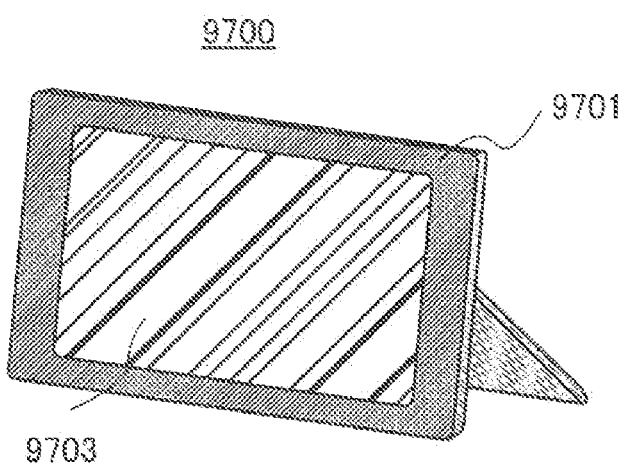

FIG. 10B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these elements may be provided for the surface on which the display portion is provided, it is preferable to provide them for the side surface or the back surface for the design of the digital photo frame 9700. For example, memory storing data of an image taken with a digital camera is inserted in the recording medium insertion portion of the digital photo frame, whereby the image data can be transferred and displayed on the display portion 9703.

The digital photo frame 9700 may be configured to transmit and receive data wirelessly. A structure may be employed in which desired image data is obtained wirelessly to be displayed.

Figure 11:
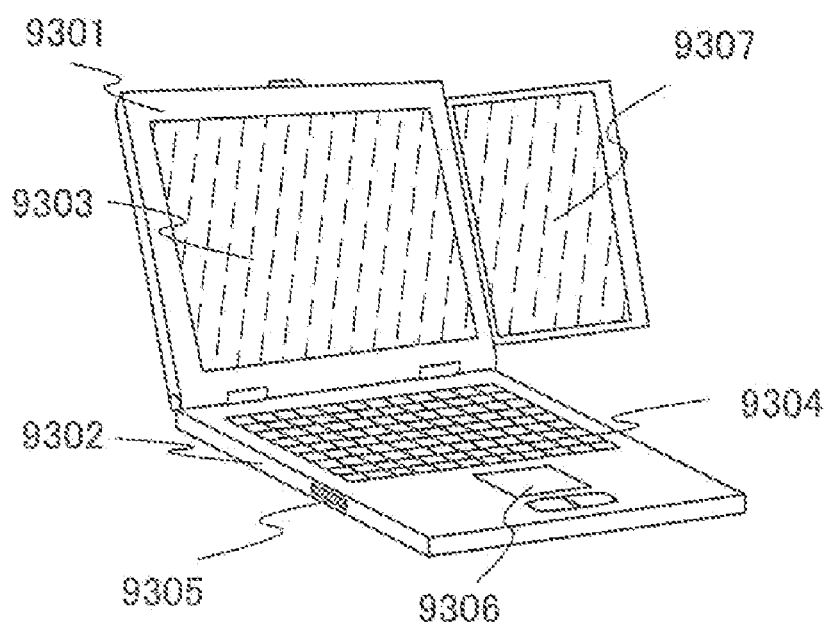
FIG. 11 is a perspective view illustrating an example of a portable computer.

FIG. 11 is a perspective view illustrating an example of a portable computer.

In the portable computer in FIG. 11, a top housing 9301 having a display portion 9303 and a bottom housing 9302 having a keyboard 9304 can overlap with each other by closing a hinge unit which connects the top housing 9301 and the bottom housing 9302. The portable computer in FIG. 11 is convenient for carrying, and in the case of using the keyboard for data input, the hinge unit is opened so that the user can input looking at the display portion 9303.

The bottom housing 9302 includes a pointing device 9306 with which data input can be performed, in addition to the keyboard 9304. Further, when the display portion 9303 is a touch input panel, data input can be performed by touching a part of the display portion. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 includes a display portion 9307 and can keep the display portion 9307 therein by sliding it toward the inside of the top housing 9301; thus, wide display screen can be achieved. In addition, the user can adjust the direction of a screen of the display portion 9307 which can be kept in the top housing 9301. When the display portion 9307 which can be kept in the top housing 9301 is a touch input panel, data input can be performed by touching part of the display portion 9307 which can be kept in the top housing 9301.

The display portion 9303 or the display portion 9307 which can be kept in the top housing 9301 uses an image display device of a liquid crystal display panel, a light-emitting display panel such as an organic light-emitting element or an inorganic light-emitting element, or the like.

In addition, the portable computer illustrated in FIG. 11 can be provided with a receiver and the like to receive TV broadcasting to display images on the display portion. The user can watch TV broadcasting when the whole screen of the display portion 9307 is exposed by sliding the display portion 9307 while the hinge unit which connects the top housing 9301 and the bottom housing 9302 is kept closed. In that case, the hinge unit is not opened and display is not performed on the display portion 9303, and start up of only a circuit for displaying the TV broadcasting is performed, so that power can be consumed to the minimum, which is useful for the portable computer whose battery capacity is limited.

EXAMPLE 1

In Example 1, a planar shape where a microcrystalline silicon film was formed over a substrate will be described with reference to FIGS. 12A and 1213, FIG. 13A and 1313, and FIGS. 14A and 1413. In Example 1, the microcrystalline silicon film formed under the first condition described in Embodiment 1 is referred to as Sample A, the microcrystalline silicon film formed under the second condition described in Embodiment 1 is referred to as Sample B, and the microcrystalline silicon film formed by stacking layers on the first and second conditions described in Embodiment 1 is referred to as Sample C.

First, a manufacturing method of Samples A to C is described below.

A 100-nm-thick silicon oxynitride film was formed as a base film over a substrate. The silicon oxynitride film was formed by a plasma CVD method in which plasma discharge was performed under the following condition: silane and nitrous oxide were introduced as source gases at flow rates of 5 sccm and 600 sccm, respectively, and were stabilized; the pressure of a process chamber was 25 Pa; the substrate temperature was 280° C.; an RF power source frequency was 13.56 MHz; and power with an RF power source was 30 W.

Next, a 30-nm-thick microcrystalline silicon film was formed over the silicon oxynitride film.

The microcrystalline silicon film of each of Sample A to C was formed by a plasma CVD method in which plasma discharge was performed under the following condition: silane, hydrogen, and argon were introduced into a process chamber as source gases and were stabilized; the pressure of the process chamber was 280 Pa; the substrate temperature was 280° C.; an RF power source frequency was 13.56 MHz; and power with an RF power source was 50 W. Particularly, in Sample A, the flow rate of silane was 10 sccm, the flow rate of hydrogen was 1500 sccm, and the flow rate of argon was 1500 sccm. In Sample B, the flow rate of silane was 7 sccm, the flow rate of hydrogen was 1500 sccm, and the flow rate of argon was 1500 sccm. In Sample C, a 3-nm-thick microcrystalline silicon film was formed under the condition for Sample A, and then a 27-nm-thick microcrystalline silicon film was formed under the condition for Sample B.

Figure 12A:
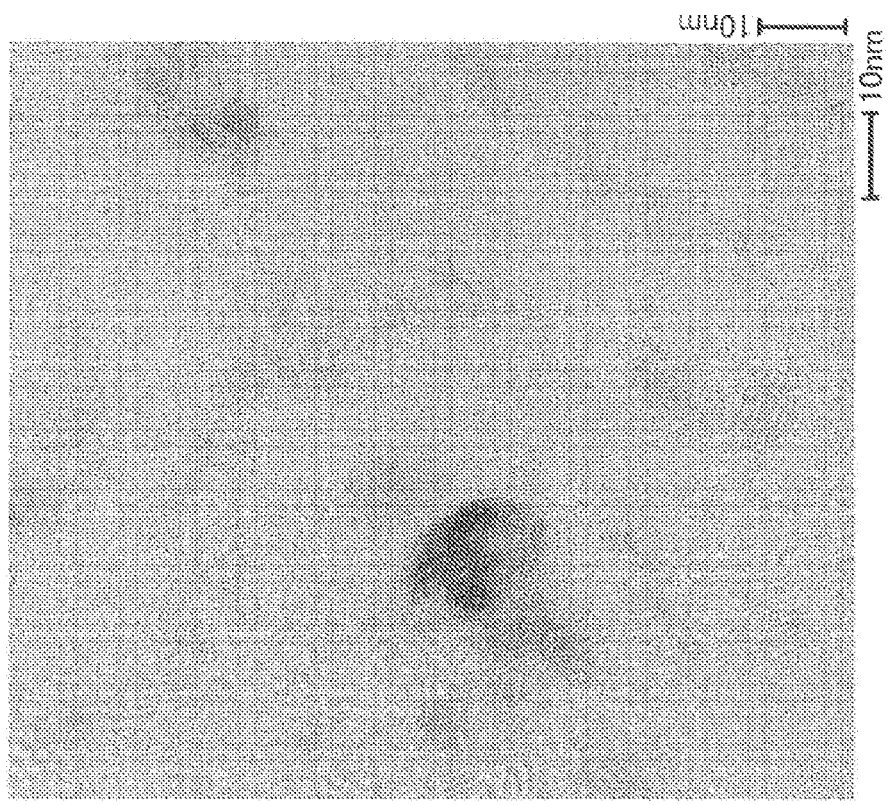
FIGS. 12A and 12B are plan-view TEM images of a microcrystalline silicon film.
Figure 12B:
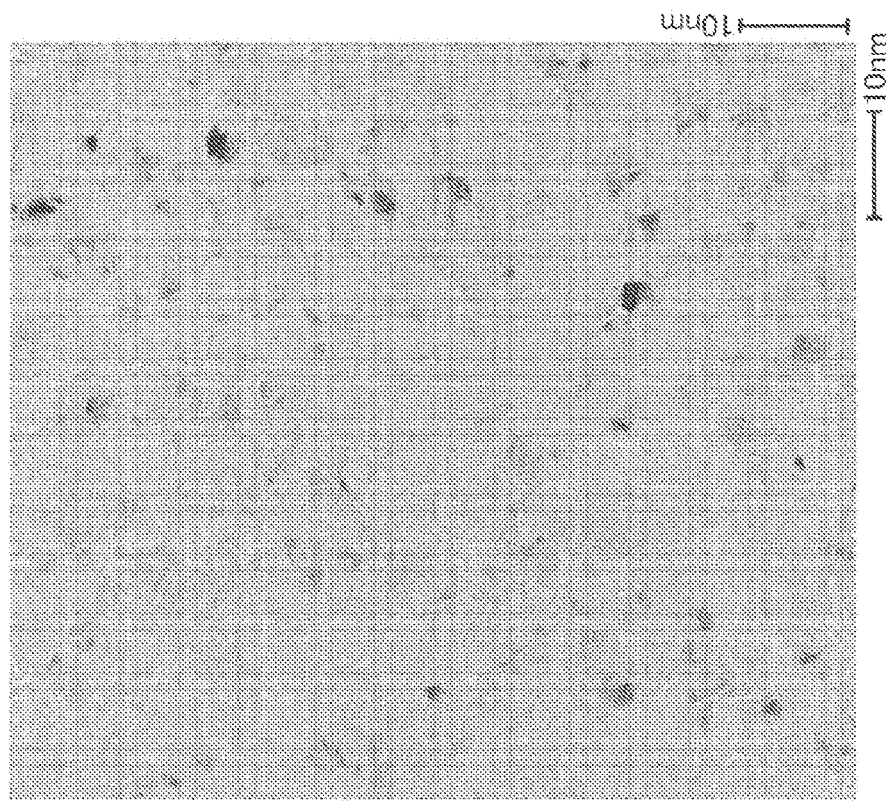

TEM images capturing a plan surface of Sample A are FIGS. 12A and 12B. The TEM images were taken by a high resolution transmission electron microscope ('H9000-NAR' produced by Hitachi, Ltd.: TEM) at a high magnification and an accelerating voltage of 300 kV. FIG. 12A is a TEM image at 0.5 million-fold magnification, and FIG. 12B is a TEM image at 2 million-fold magnification.

In FIG. 12B, a region where a lattice fringe is observed is a crystallite which is a minute crystal that is regarded as a single crystal, and an amorphous region is formed around the region. A region observed as being white in color is a space between crystal grains.

Figure 13B:
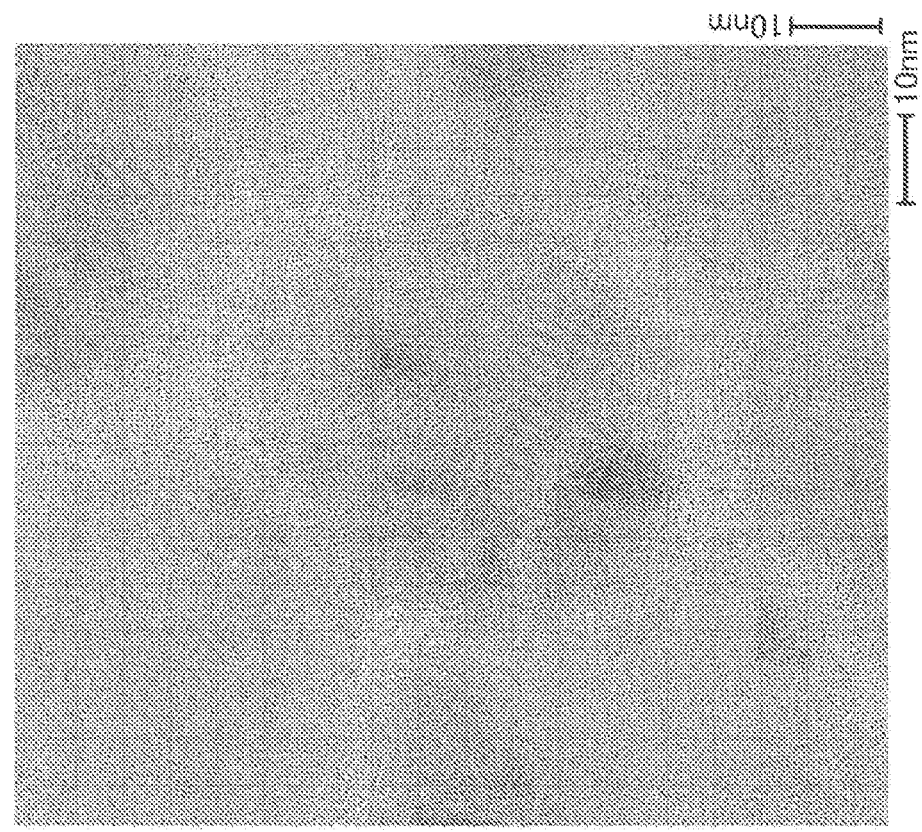
FIGS. 13A and 13B are plan-view TEM images of a microcrystalline silicon film.
Figure 13A:
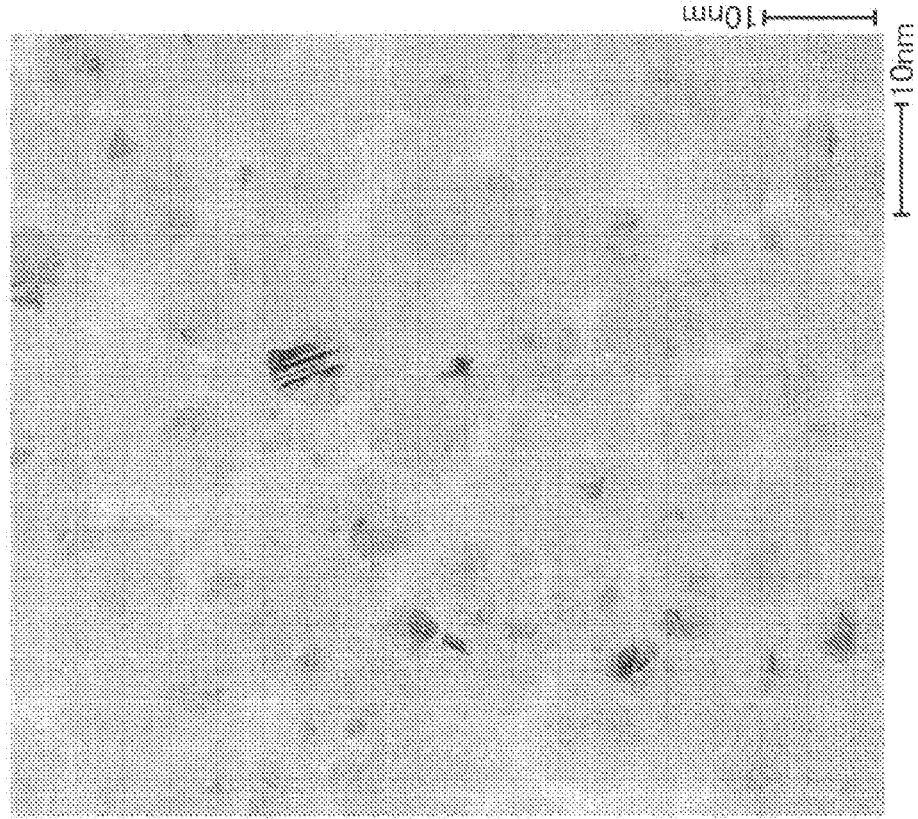

TEM images capturing a plan surface of Sample B are FIGS. 13A and 13B. FIG. 13A is a TEM image at 0.5 million-fold magnification, and FIG. 13B is a TEM image at 2 million-fold magnification.

It is seen from FIG. 13B that the grain size of a crystal grain becomes large and there are many regions observed as being white in color between the crystal grains. In addition, as compared to FIG. 12B, a region where a lattice fringe is observed has many crystal regions and contrasty. Accordingly, it can be found that the crystallinity is improved whereas a space is formed between crystal grains by forming the microcrystalline silicon film under the second condition.

Figure 14A:
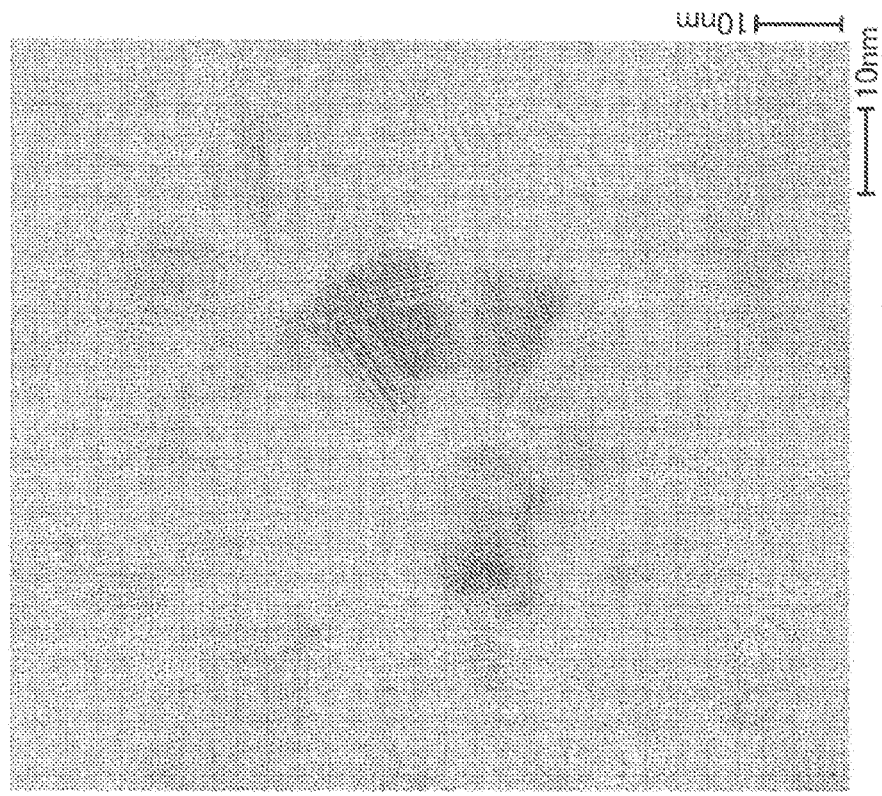
FIGS. 14A and 14B are plan-view TEM images of a microcrystalline silicon film.
Figure 14B:
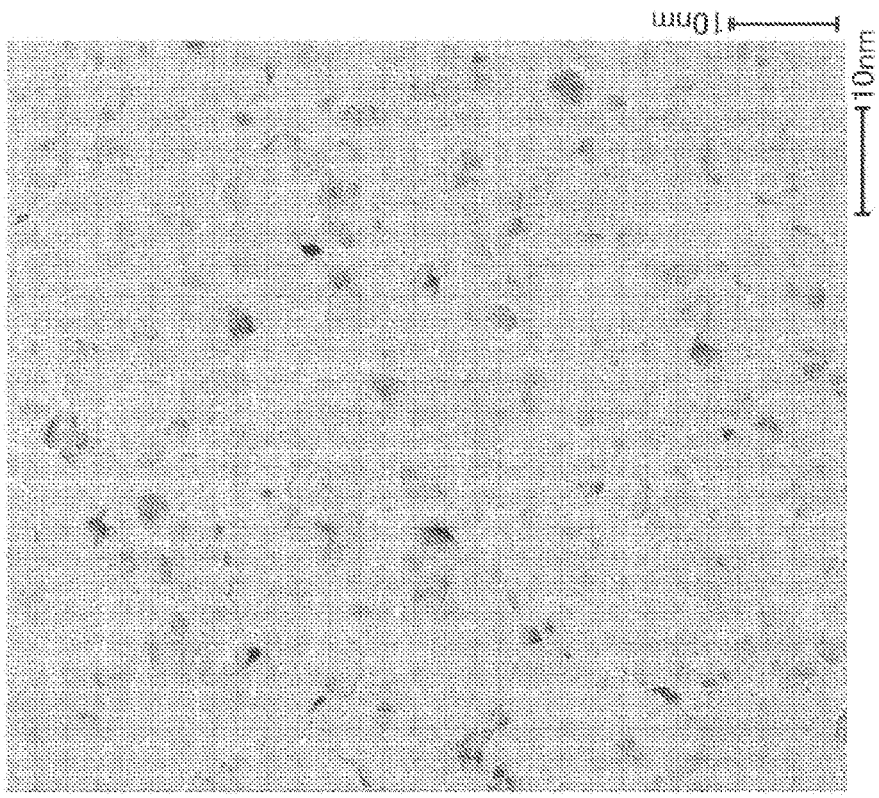

TEM images capturing a plan surface of Sample C are FIGS. 14A and 14B. FIG. 14A is a TEM image at 0.5 million-fold magnification, and FIG. 14B is a TEM image at 2 million-fold magnification.

In FIG. 14B, as compared to FIGS. 12B and 13B, there are many crystallites where a lattice fringe is observed. In addition, there are few regions observed as being white in color between crystal grains, as compared to FIG. 13B. Accordingly, a microcrystalline semiconductor film with high crystallinity and less space between crystal grains can be formed by employing the first and second conditions.

EXAMPLE 2

In Example 2, electric characteristics of a thin film transistor (Sample D) in which a microcrystalline silicon film was formed under the second condition and a thin film transistor (Sample E) in which a microcrystalline silicon film was formed under the first condition and then a microcrystalline silicon film was formed to be stacked under the second condition will be described.

First, a manufacturing process of the thin film transistors is described with reference to FIGS. 1A to 1D and 2A and 2B.

A base insulating film (not shown) was formed over a substrate 101, and a gate electrode 103 was formed over the base insulating film.

In this example, a glass substrate (EAGLE XG produced by Corning Incorporated) was used as the substrate 101.

A 50-nm-thick titanium film was formed over the base insulating film by sputtering a titanium target with argon ions at a flow rate of 20 sccm. Then, a 100-nm-thick aluminum film was formed thereover by sputtering an aluminum target with argon ions at a flow rate of 50 sccm. Then, a 50-nm-thick titanium film was formed thereover by sputtering a titanium target with argon ions at a flow rate of 20 sccm. After that, a resist was applied over the titanium film and is irradiated with light with the use of a first photomask and developed to form a resist mask.

Next, etching was performed using the resist mask, so that the gate electrode 103 was formed. In this example, an inductively coupled plasma (ICP) etching apparatus was used; first etching was performed under a condition in which the ICP power was 600 W, the bias power was 250 W, the pressure was 1.2 Pa, and as etching gases, boron trichloride at a flow rate of 60 sccm and chlorine at a flow rate of 20 sccm were used; after that, second etching was performed under a condition in which the ICP power was 500 W, the bias power was 50 W, the pressure was 2.0 Pa, and as an etching gas, carbon fluoride at a flow rate of 80 sccm was used.

After that, the resist mask was removed.

Next, a gate insulating film 105 was formed over the gate electrode 103 and the base insulating film. Then, the substrate was carried out of the process chamber, the inside of the process chamber was cleaned, an amorphous silicon film was deposited as a protective film inside of the process chamber, and the substrate was carried into the process chamber. Then, a microcrystalline semiconductor layer was formed.

In Sample D, as the gate insulating film 105, a 110-nm-thick silicon nitride film and a 110-nm-thick silicon oxynitride film were formed. In Sample E, as the gate insulating film 105, a 250-nm-thick silicon nitride film and a 30-nm-thick silicon oxynitride film were formed.

The silicon nitride film was formed by a plasma CVD method in which plasma discharge was performed under the following condition: silane, hydrogen, nitrogen, and ammonia were introduced as source gases at flow rates of 40 sccm, 500 sccm, 550 sccm, and 140 sccm and were stabilized; the pressure of the process chamber was 100 Pa; the substrate temperature was 280° C.; an RF power source frequency was 13.56 MHz; and power with an RF power source was 370 W.

The silicon oxynitride film was formed by a plasma CVD method in which plasma discharge was performed under the following condition: silane and nitrogen monoxide were introduced as source gases at flow rates of 5 sccm and 600 sccm and were stabilized; the pressure of the process chamber was 25 Pa; the substrate temperature was 280° C.; an RF power source frequency was 13.56 MHz; and power with an RF power source was 30 W.

In Sample D, as the microcrystalline semiconductor film, a 70-nm-thick microcrystalline silicon film was formed over the gate insulating film 105 under the second condition. In Sample E, a 3-nm-thick microcrystalline silicon film was folioed over the gate insulating film 105 under the first condition as a first microcrystalline semiconductor film 107 as shown in FIG. 1A, and then, a 67-nm-thick microcrystalline silicon film was formed under the second condition as a second microcrystalline semiconductor film 109 as shown in FIG. 1B.

According to the first condition, the microcrystalline semiconductor film was formed by a plasma CVD method in which plasma discharge was performed under the following condition: silane, hydrogen, and argon were introduced as source gases at flow rates of 10 sccm, 1500 sccm, and 1500 sccm, respectively (the flow rate of hydrogen is 150 times as high as that of silane) and were stabilized; the pressure of the process chamber was 280 Pa; the substrate temperature was 280° C.; an RF power source frequency was 13.56 MHz; and power with an RF power source was 50 W.

According to the second condition, the microcrystalline semiconductor film was formed by a plasma CVD method in which plasma discharge was performed under the following condition: silane, hydrogen, and argon were introduced as source gases at flow rates of 7 sccm, 1500 sccm, and 1500 sccm, respectively (the flow rate of hydrogen is 214 times as high as that of silane) and were stabilized; the pressure of the process chamber was 280 Pa; the substrate temperature was 280° C.; an RF power source frequency was 13.56 MHz; and power with an RF power source was 50 W.

Next, a semiconductor film 111 was formed over the microcrystalline semiconductor film, and an impurity semiconductor film 113 was formed over the semiconductor film 111.

A 80-nm-thick silicon film was formed as the semiconductor film 111 by a plasma CVD method in which plasma discharge was performed under the following condition: silane, 1000 ppm ammonia (diluted with hydrogen), hydrogen, and argon were introduced as source gases at flow rates of 40 sccm, 125 sccm, 1375 sccm, and 2000 sccm, respectively, and were stabilized; the pressure of the process chamber was 280 Pa; the substrate temperature was 280° C.; an RF power source frequency was 13.56 MHz; and power with an RF power source was 100 W.

As the impurity semiconductor film 113, an amorphous silicon film to which phosphorus was added was formed to a thickness of 50 nm. A plasma CVD method in which plasma discharge was employed under the following condition to form the amorphous silicon film: the deposition temperature was 280° C.; silane and 0.5% phosphine (diluted with hydrogen) were introduced at flow rates of 100 sccm and 170 sccm, respectively; the pressure was 170 Pa; an RF power source frequency was 13.56 MHz; and power with an RF power source was 60 W.

Next, a resist was applied over the impurity semiconductor film 113 and was irradiated with light with the use of a second photomask and developed to form a resist mask 115. The process up to and including this step is illustrated in FIG. 1C.

With the use of the resist mask, the microcrystalline semiconductor film, the semiconductor film 111, and the impurity semiconductor film 113 were etched to form a semiconductor stack 117 including a microcrystalline semiconductor region 117a and an amorphous semiconductor region 117b and an impurity semiconductor film 121.

In this example, an ICP apparatus was used, and the etching was performed under the following condition: the source power was 1000 W, the bias power was 80 W, the pressure was 1.51 Pa, and chlorine at a flow rate of 100 sccm was used as an etching gas. Then, the resist mask was removed (see FIG. 1D).

Next, as shown in FIG. 5A, a conductive film 127 was formed over the gate insulating film 105, the semiconductor stack 117, and the impurity semiconductor film 121. In this example, a 50-nm-thick titanium film was formed by sputtering a titanium target with argon ions at a flow rate of 20 sccm, a 200-nm-thick aluminum film was formed over the titanium layer by sputtering an aluminum target with argon ions at a flow rate of 50 sccm, and a 50-nm-thick titanium film was formed over the aluminum layer by sputtering a titanium target with argon ions at a flow rate of 20 sccm.

Next, a resist was applied over the conductive film 127 and was irradiated with light with the use of a third photomask and developed to form a resist mask. Dry etching was performed on the conductive film 127 with the use of the resist mask, so that wirings 129a and 129b were formed. Next, dry etching was performed on the impurity semiconductor film 121, so that a pair of impurity semiconductor films 131a and 131b which function as a source region and a drain region were formed. Further, the semiconductor stack 117 was partly etched to form a semiconductor stack 133 including a microcrystalline semiconductor region 133a and a pair of amorphous semiconductor regions 133b.

In this example, the etching was performed under the following condition: the ICP power was 450 W; the bias power was 100 W; the pressure was 1.9 Pa; and boron chloride at a flow rate of 60 sccm and chlorine at a flow rate of 20 sccm were used as etching gases.

The semiconductor stack 117 was etched to a depth of 100 nm to 120 nm from the top surface of the semiconductor stack 117 such that the thickness of a region of the semiconductor stack 133, which is covered with neither the wiring 129a nor the wiring 129b was 30 nm to 50 nm. In this example, the planar shape of each of the wirings 129a and 129b functioning as a source electrode and a drain electrode was linear.

Next, the top surface of the semiconductor stack 133 was irradiated with carbon fluoride plasma, so that impurity remaining on the top surface of the semiconductor layer 133 was removed. In this example, the following etching condition was employed: the source power was 1000 W, the bias power was 0 W, the pressure was 0.67 Pa, and carbon fluoride at a flow rate of 100 sccm was used as an etching gas.

Next, the top surface of the semiconductor stack 133 was irradiated with water plasma, so that a surface defect of the semiconductor stack 133 was reduced and the insulation properties of the source and drain regions were improved. In this example, the semiconductor stack 133 was irradiated with plasma which was generated by introducing water vapor at a flow rate of 300 sccm, at a source power of 1800 W, and at a pressure of 66.5 Pa.

After that, the resist mask was removed. The process up to and including this step is illustrated in FIG. 5B.

Next, a silicon nitride film was formed as an insulating film 137. A 300-nm-thick silicon nitride film was formed as the insulating film 137 by plasma discharging under the following condition: silane, ammonia, nitrogen, and hydrogen were introduced as source gases at flow rates of 20 sccm, 220 sccm, 450 sccm, and 450 sccm, respectively; the pressure in the process chamber was 160 Pa; the substrate temperature was 250° C.; and the output was 200 W.

Next, a resist was applied over the insulating film 137 and was irradiated with light with the use of a fourth photomask and developed to form a resist mask. With the use of the resist mask, part of the insulating film was etched by a dry etching method so that the wirings 129a and 129b functioning as the source and drain electrodes were exposed. In addition, part of the insulating film 137 and part of the gate insulating film 105 were etched by a dry etching method so that the gate electrode 103 was exposed. After that, the resist mask was removed.

Next, a conductive film was formed over the insulating film 137. After that, a resist was applied over the conductive film and was irradiated with light with the use of a fifth photomask and developed to form a resist mask. With the use of the resist mask, part of the conductive film was etched by a wet etching method, so that a back-gate electrode 139 was formed.

In this example, as the conductive film, a 50-nm-thick indium tin oxide containing silicon oxide was formed by a sputtering method, and was subjected to a wet-etching treatment, so that the back-gate electrode 139 was formed. Although not shown, the back-gate electrode 139 was connected to the gate electrode 103.

After that, the resist mask was removed. Through the above steps, a dual-gate thin film transistor was manufactured (see FIG. 5C).

Figure 15A:
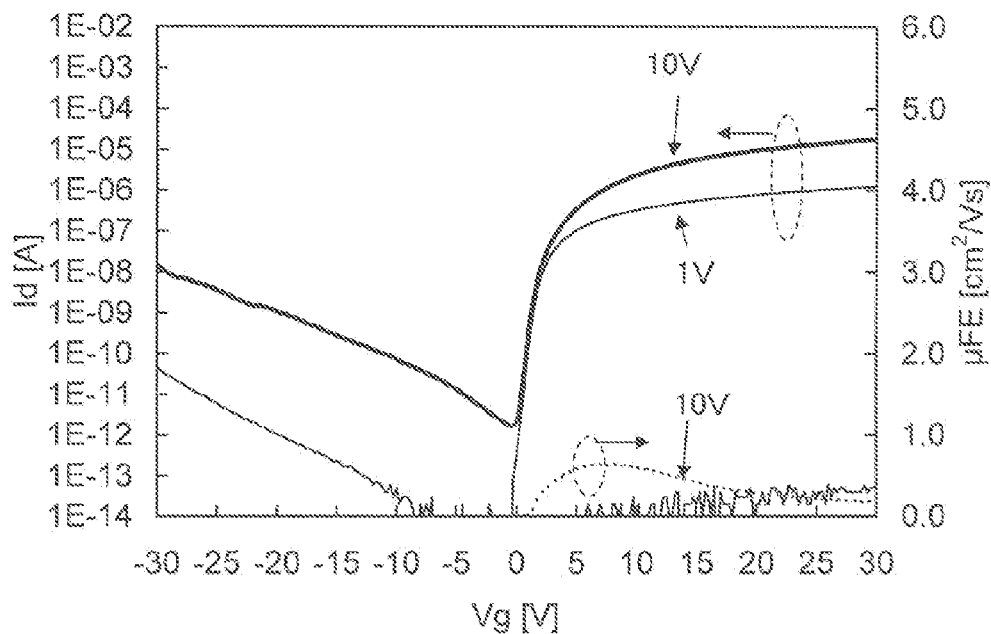
FIGS. 15A and 15B are graphs showing electric characteristics of a thin film transistor.
Figure 15B:
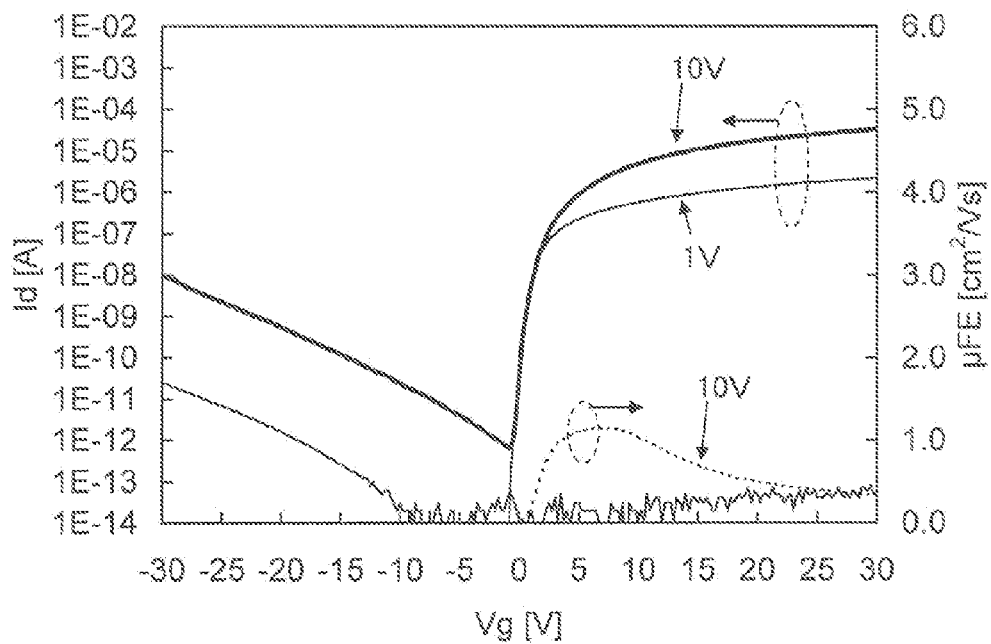
Figure 16A:
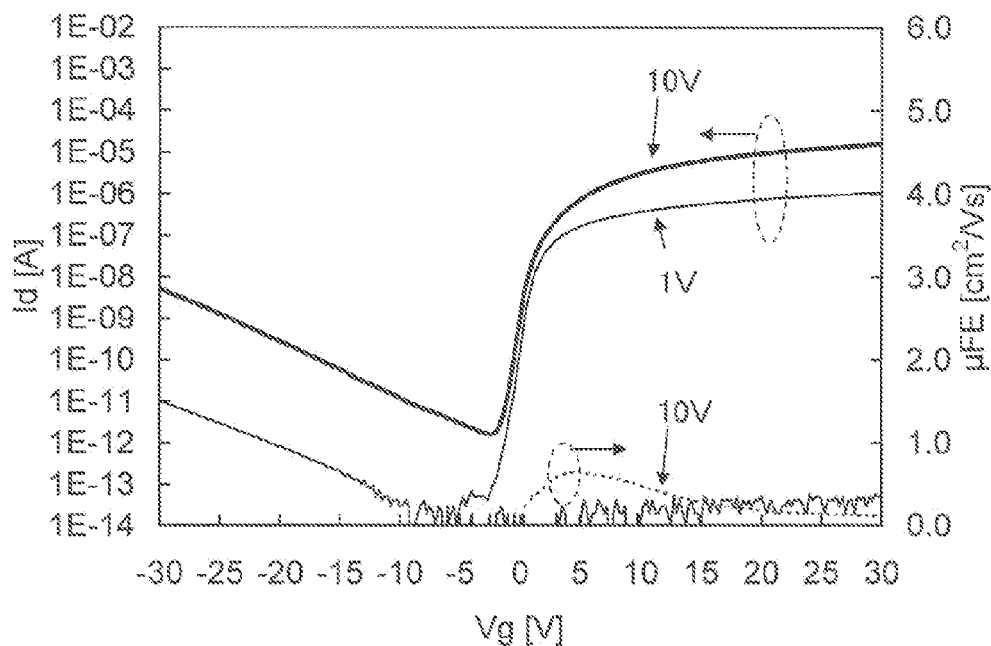
FIGS. 16A and 16B are graphs showing electric characteristics of a thin film transistor.
Figure 16B:
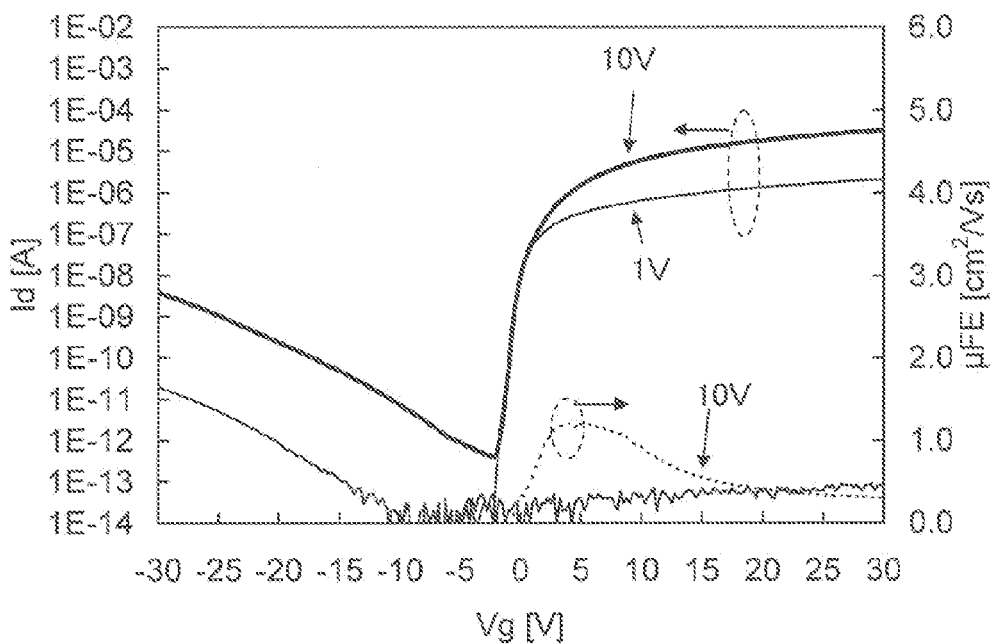

Results obtained by measuring current vs. voltage characteristics of the thin film transistor of Sample D are shown in FIGS. 15A and 15B; Results obtained by measuring current vs. voltage characteristics of the thin film transistor of Sample E are shown in FIGS. 16A and 16B. FIGS. 15A and 16A each show the electric characteristics when a gate voltage was applied only to the gate electrode 103; FIGS. 15B and 16B each show the electric characteristics when the gate voltage was applied to the gate electrode 103 and the back-gate electrode 139.

Further. Table 1 shows, in each of the thin film transistors of Samples D and E, the on-state current at a drain voltage of 10 V and a gate voltage of 15 V (denoted by Ion), the minimum off-state current (denoted by Ioff_min), the off-state current at a gate voltage which is lower than the gate voltage at the minimum off-state current by 10 V (denoted by Ioff), the threshold voltage (denoted by Vth), the S value (denoted by S-value), the ratio of on-state current to minimum off-state current (denoted by Ion/Ioff_min), and the field-effect mobility at a drain voltage of 10 V ($\mu$FE_sat). These values are separately shown in columns denoted by bottom gate and in columns denoted by dual gate; the values shown in the columns denoted by bottom gate were measured when the gate voltage was applied only to the gate electrode 103, and the values shown in the columns denoted by dual gate were measured when the gate voltage was applied to the gate electrode 103 and the back-gate electrode 139.

TABLE 1

|  | Sample D | | Sample E | |
| --- | --- | --- | --- | --- |
|  | bottom gate | dual gate | bottom gate | dual gate |
| Ion [$\mu$A] | 5.74 | 10.99 | 6.25 | 12.23 |
| Ioff_min [pA] | 1.65 | 0.62 | 1.60 | 0.39 |
| Ioff [pA] | 79.12 | 31.93 | 26.29 | 18.16 |
| Vth [V] | 1.95 | 1.34 | 0.50 | 0.26 |
| S-value [V/dec] | 0.38 | 0.27 | 0.49 | 0.33 |
| Ion/Ioff_min [digit] | 6.54 | 7.25 | 6.59 | 7.50 |
| $\mu$FE_sat [cm$^2$/Vs] | 0.65 | 1.16 | 0.64 | 1.22 |

In Sample D, the filed-effect mobility of the dual-gate thin film transistor is 1.79 times as high as that of the bottom-gate thin film transistor. In Sample E, the filed-effect mobility of the dual-gate thin film transistor is 1.89 times as high as that of the bottom-gate thin film transistor. Accordingly, by forming the first microcrystalline semiconductor film under the first condition and then forming the second microcrystalline semiconductor film under the second condition, a microcrystalline semiconductor film in which a space between crystal grains is reduced and the crystallinity can be improved not only on the gate electrode side but also on the back-gate electrode side can be formed, so that the filed-effect mobility of the thin film transistor can be increased. Therefore, by using the thin film transistor to switch of a pixel in a display device, the display device achieves high contrast and high image quality. Further, the size of the thin film transistor can be decreased, so that the frame size of the display device can be decreased by forming a driver circuit using the thin film transistor.

This application is based on Japanese Patent Application serial No. 2010-036699 filed with Japan Patent Office on Feb. 22, 2010, the entire content of which is hereby incorporated by reference.

What is claimed is:

1. A method for manufacturing a thin film transistor comprising steps of:
    forming a gate electrode over a substrate;
    forming a gate insulating film over the substrate and the gate electrode;
    forming a first microcrystalline semiconductor film over the gate insulating film under a first condition;
    forming a second microcrystalline semiconductor film over the first microcrystalline semiconductor film under a second condition;
    forming a semiconductor film including a microcrystalline semiconductor region and an amorphous semiconductor region over the second microcrystalline semiconductor film;
    forming a first impurity semiconductor film over the semiconductor film;
    etching a part of the first impurity semiconductor film to form an island-shaped second impurity semiconductor film;
    etching parts of the first microcrystalline semiconductor film, the second microcrystalline semiconductor film, and the semiconductor film to form an island-shaped first semiconductor stack;
    forming a pair of wirings over the island-shaped second impurity semiconductor film;
    etching the island-shaped second impurity semiconductor film to form a pair of impurity semiconductor films;
    etching a part of the island-shaped first semiconductor stack to form a second semiconductor stack in which a microcrystalline semiconductor region and a pair of amorphous semiconductor regions are stacked;
    forming an insulating film over the pair of wirings after forming the second semiconductor stack,
    wherein the pair of amorphous semiconductor regions is spaced from each other,
    wherein the insulating film is in contact with the microcrystalline semiconductor region in a region between the pair of amorphous semiconductor regions,
    wherein the first condition is a condition in which a microcrystalline semiconductor film in which a space between crystal grains is filled with an amorphous semiconductor is formed, and
    wherein the second condition is a condition in which crystal growth proceeds.

2. The method for manufacturing a thin film transistor according to claim 1, wherein a side wall of the island-shaped first semiconductor stack is exposed to plasma before the pair of wirings are formed over the island-shaped first semiconductor stack, so that a bank region is formed on the side wall of the island-shaped first semiconductor stack.

3. The method for manufacturing a thin film transistor according to claim 1, wherein the first condition and the second condition are performed at 200° C. to 280° C.

4. A method for manufacturing a thin film transistor comprising steps of:
forming a first gate electrode over a substrate;
forming a first gate insulating film over the substrate and the first gate electrode;
forming a first microcrystalline semiconductor film over the first gate insulating film under a first condition;
forming a second microcrystalline semiconductor film over the first microcrystalline semiconductor film under a second condition;
forming a semiconductor film including a microcrystalline semiconductor region and an amorphous semiconductor region over the second microcrystalline semiconductor film;
forming a first impurity semiconductor film over the semiconductor film;
etching a part of the first impurity semiconductor film to form an island-shaped second impurity semiconductor film;
etching parts of the first microcrystalline semiconductor film, the second microcrystalline semiconductor film, and the semiconductor film to form an island-shaped first semiconductor stack;
forming a pair of wirings over the island-shaped second impurity semiconductor film;
etching the island-shaped second impurity semiconductor film to form a pair of impurity semiconductor films;
etching a part of the island-shaped first semiconductor stack to form a second semiconductor stack in which a microcrystalline semiconductor region and a pair of amorphous semiconductor regions are stacked;
forming a second gate insulating film over the pair of wirings; and
forming a second gate electrode over the second gate insulating film,
wherein the pair of amorphous semiconductor regions is spaced from each other,
wherein the second gate insulating film is in contact with the microcrystalline semiconductor region in a region between the pair of amorphous semiconductor regions,
wherein the first condition is a condition in which a microcrystalline semiconductor film in which a space between crystal grains is filled with an amorphous semiconductor is formed, and
wherein the second condition is a condition in which crystal growth proceeds.

5. The method for manufacturing a thin film transistor according to claim 4, wherein a side wall of the island-shaped first semiconductor stack is exposed to plasma before the pair of wirings are formed over the island-shaped first semiconductor stack, so that a bank region is formed on the side wall of the island-shaped first semiconductor stack.

6. The method for manufacturing a thin film transistor according to claim 4, wherein the first condition and the second condition are performed at 200° C. to 280° C.

7. A method for manufacturing a thin film transistor comprising steps of:
forming a first gate electrode over a substrate;
forming a first gate insulating film over the substrate and the first gate electrode;
forming a first microcrystalline semiconductor film over the first gate insulating film by a plasma CVD method under a first condition;
forming a second microcrystalline semiconductor film over the first microcrystalline semiconductor film by a plasma CVD method under a second condition;
forming a semiconductor film including a microcrystalline semiconductor region and an amorphous semiconductor region over the second microcrystalline semiconductor film;
forming a first impurity semiconductor film over the semiconductor film;
etching a part of the first impurity semiconductor film to form an island-shaped second impurity semiconductor film;
etching parts of the first microcrystalline semiconductor film, the second microcrystalline semiconductor film, and the semiconductor film to form an island-shaped first semiconductor stack;
forming a pair of wirings over the island-shaped second impurity semiconductor film;
etching the island-shaped second impurity semiconductor film to form a pair of impurity semiconductor films;
etching a part of the island-shaped first semiconductor stack to form a second semiconductor stack in which a microcrystalline semiconductor region and a pair of amorphous semiconductor regions are stacked;
forming a second gate insulating film over the pair of wirings; and
forming a second gate electrode over the second gate insulating film,
wherein the pair of amorphous semiconductor regions is spaced from each other,
wherein the second gate insulating film is in contact with the microcrystalline semiconductor region in a region between the pair of amorphous semiconductor regions,
wherein a flow rate of hydrogen is 125 times or more as high as a flow rate of a deposition gas containing silicon or germanium and is 180 times or less as high as the flow rate of the deposition gas in the first condition, and
wherein a flow rate of hydrogen is 210 times or more as high as a flow rate of a deposition gas containing silicon or germanium and is 1500 times or less as high as the flow rate of the deposition gas in the second condition.

8. The method for manufacturing a thin film transistor according to claim 7, wherein a side wall of the island-shaped first semiconductor stack is exposed to plasma before the pair of wirings are formed over the island-shaped first semiconductor stack, so that a bank region is formed on the side wall of the island-shaped first semiconductor stack.

9. The method for manufacturing a thin film transistor according to claim 7, wherein the first condition and the second condition are performed at 200° C. to 280° C.

* * * * *

UNITED STATES PATENT AND TRADEMARK OFFICE
CERTIFICATE OF CORRECTION

PATENT NO.       : 8,383,434 B2
APPLICATION NO.  : 13/020827
DATED            : February 26, 2013
INVENTOR(S)      : Toshiyuki Isa et al.

It is certified that error appears in the above-identified patent and that said Letters Patent is hereby corrected as shown below:

In the Specification:

Column 4, line 42, "FIGS. 5A to SC" should read "FIGS. 5A to 5C"

Column 6, line 32, "fanned" should read "formed"

Column 22, line 64, "FIGS. 12A and 1213" should read "FIGS. 12A and 12B"

Column 22, line 64, "FIGS. 13A and 1313" should read "FIGS. 13A and 13B"

Column 22, line 65, "FIGS. 14A and 1413" should read "FIGS. 14A and 14B"

Column 25, line 8, "folioed over" should read "formed over"

Signed and Sealed this
Twenty-eighth Day of May, 2013

Teresa Stanek Rea
*Acting Director of the United States Patent and Trademark Office*